(12) United States Patent
Lee

(10) Patent No.: US 8,471,362 B2
(45) Date of Patent: Jun. 25, 2013

(54) THREE-DIMENSIONAL STACKED STRUCTURE SEMICONDUCTOR DEVICE HAVING THROUGH-SILICON VIA AND SIGNALING METHOD FOR THE SEMICONDUCTOR DEVICE

(75) Inventor: Jong-joo Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 233 days.

(21) Appl. No.: 13/080,042

(22) Filed: Apr. 5, 2011

(65) Prior Publication Data

US 2011/0309475 A1    Dec. 22, 2011

(30) Foreign Application Priority Data

Jun. 18, 2010   (KR) .................... 10-2010-0058233

(51) Int. Cl.
*H01L 21/02*         (2006.01)

(52) U.S. Cl.
USPC .... 257/532; 257/621; 257/698; 257/E23.174; 257/E29.345

(58) Field of Classification Search
USPC .......... 257/532, 621, 698, E23.174, E29.345
See application file for complete search history.

(56) References Cited

U.S. PATENT DOCUMENTS

| 7,385,281 | B2 | 6/2008 | Nishio et al. | |
|---|---|---|---|---|
| 8,148,814 | B2 * | 4/2012 | Furuta et al. | 257/723 |
| 2009/0086524 | A1 * | 4/2009 | Alam et al. | 365/94 |
| 2010/0078635 | A1 | 4/2010 | Kuroda et al. | |

FOREIGN PATENT DOCUMENTS

KR    1020100011613 A    2/2010

* cited by examiner

*Primary Examiner* — Tu-Tu Ho
(74) *Attorney, Agent, or Firm* — Volentine & Whitt, PLLC

(57) ABSTRACT

A three-dimensional (3D) semiconductor device including a plurality of stacked layers and a through-silicon via (TSV) electrically connecting the plurality of layers, in which in signal transmission among the plurality of layers, the TSV transmits a signal that swings in a range from an offset voltage that is higher than a ground voltage to a power voltage, thereby minimizing an influence of a metal-oxide-semiconductor (MOS) capacitance of TSV.

18 Claims, 27 Drawing Sheets

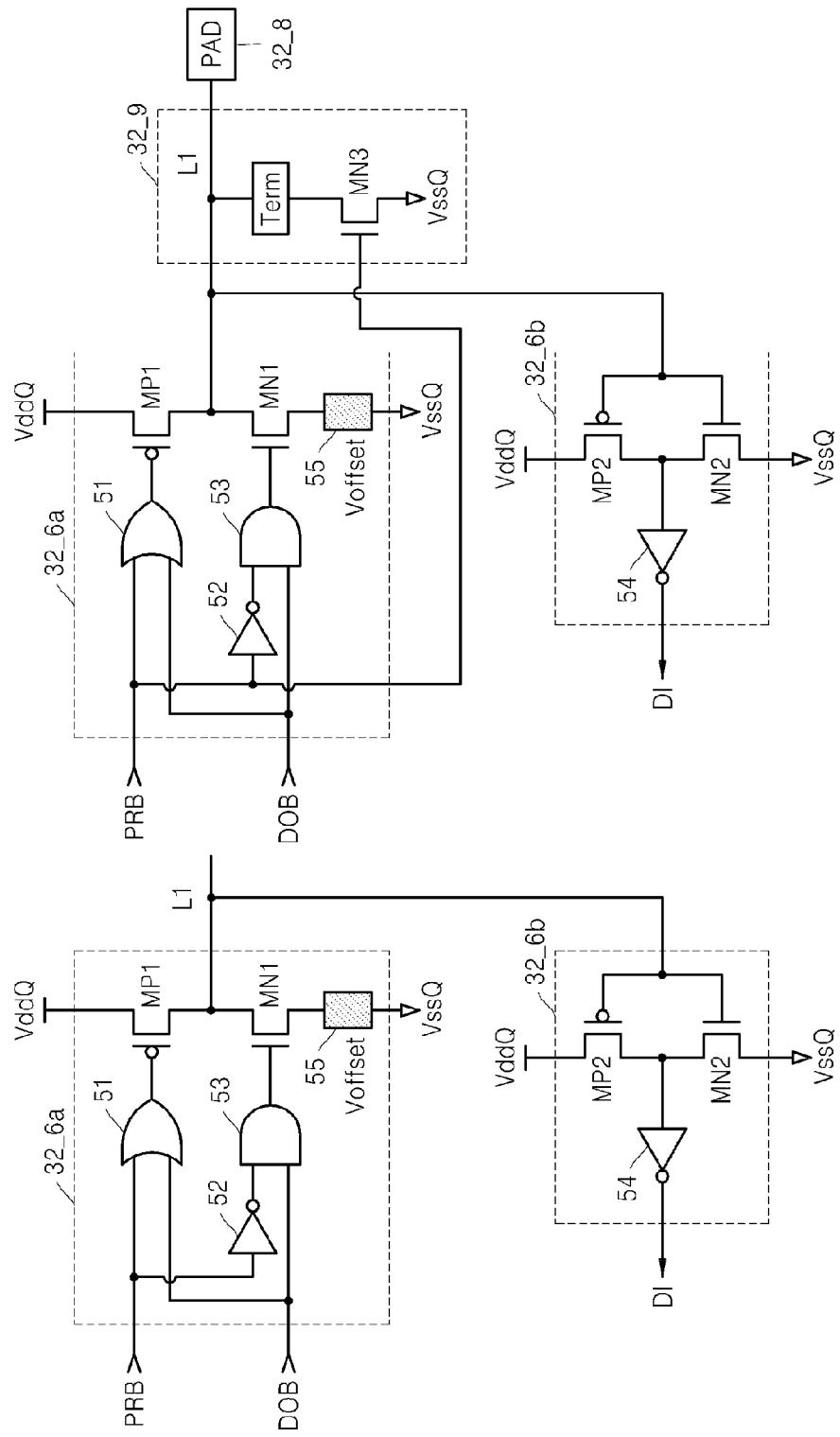

THREE-DIMENSIONAL STACKED STRUCTURE SEMICONDUCTOR DEVICE HAVING THROUGH-SILICON VIA AND SIGNALING METHOD FOR THE SEMICONDUCTOR DEVICE

CROSS-REFERENCE TO RELATED APPLICATIONS

A claim of priority is made to Korean Patent Application No. 10-2010-0058233, filed on Jun. 18, 2010, in the Korean Intellectual Property Office, the disclosure of which is incorporated herein in its entirety by reference.

BACKGROUND

The inventive concept relates to a semiconductor device having a three-dimensional (3D) structure, and more particularly, to a structure and method for offset signaling of a 3D-structure semiconductor device having a through-silicon via (TSV).

As semiconductor devices, for example, memory devices, have been highly integrated, high integration with typical two-dimensional (2D) structures has almost reached its limit. There remains the need for implementing a semiconductor memory device having a 3D structure exceeding a 2D structure in terms of integration, and research for implementing the semiconductor memory device also has been much attempted.

In the 3D semiconductor memory device, various signals such as data, commands, and addresses are transmitted, some or all of which are transmitted through a TSV. In a high-performance and high-integration semiconductor memory device, the signal transmission feature may be degraded, and such degradation may also occur when signal transmission is performed through the TSV.

SUMMARY

The inventive concept provides a semiconductor device having a three-dimensional (3D) structure, which is capable of overcoming the foregoing problems.

The inventive concept also provides a semiconductor device having a 3D structure, which can minimize an influence of a metal-oxide-semiconductor (MOS) capacitance of a TSV, and a signaling method for the semiconductor device.

According to an aspect of the inventive concept, there is provided a three-dimensional (3D) semiconductor device including a plurality of stacked layers and a through-silicon via (TSV) electrically connecting the plurality of layers, in which in signal transmission among the plurality of layers, the TSV transmits a signal that swings in a range from an offset voltage that is higher than a ground voltage to a power voltage.

According to another aspect of the inventive concept, there is provided a three-dimensional (3D) semiconductor device including a plurality of stacked layers and a through-silicon via (TSV) electrically connecting the plurality of layers, in which the TSV includes a first conductive material, an insulator is disposed between the first conductive material and a second conductive material of each layer, and the first conductive material, the insulator, and the second conductive material form a capacitor, and first and second logics of a signal transmitted through the TSV are higher than a level of the ground voltage.

According to another aspect of the inventive concept, there is provided a three-dimensional (3D) semiconductor device including a first layer including at least one memory cell and input/output buffer; a second layer comprising an interface circuit for interfacing with the memory cell and an external device and controlling the memory cell, the second layer being stacked with the first layer; at least one through-silicon via (TSV) electrically connecting the first layer and the second layer by passing through at least a portion of the first layer, wherein in signal transmission between the first layer and the second layer, the TSV transmits a signal that swings in a range from an offset voltage that is higher than a ground voltage to a power voltage.

According to another aspect of the inventive concept, there is provided a three-dimensional (3D) semiconductor device including a first layer including at least one memory cell and input/output buffer, a second layer including an interface with the memory cell and an external device and an interface circuit for controlling the memory cell, the second layer being stacked with the first layer, first and second through-silicon via (TSV) electrically connecting the first layer and the second layer by passing through at least a portion of the first layer, in which in signal transmission between the first layer and the second layer, the first TSV transmits a signal that swings in a range from an offset voltage that is higher than a ground voltage to a power voltage, and in signal transmission between the first layer and the second layer, the second TSV transmits a signal that swings in a range from the ground voltage to the power voltage.

BRIEF DESCRIPTION OF THE DRAWINGS

Exemplary embodiments of the inventive concept will be more clearly understood from the following detailed description taken in conjunction with the accompanying drawings in which:

FIG. 5 shows circuit diagrams illustrating examples of a input/output buffer having an offset circuit, according to exemplary embodiments of the inventive concept;

DETAILED DESCRIPTION OF THE EMBODIMENTS

Hereinafter, exemplary embodiments of the inventive concept will be described in detail with reference to the accompanying drawings, without any other intention than to provide thorough understanding of the inventive concept to those of ordinary skill in the art.

Memory devices include volatile memories such as dynamic random access memory (DRAM), static random access memory (SRAM), etc., and non-volatile memories which do not need to be refreshed, such as phase change random access memory (PRAM), resistive random access memory (RRAM) using variable resistance substances like complex metal oxides, and magnetic random access memory (MRAM) using ferromagnetic substances. Recently, a refresh operation has been applied to non-volatile memories.

All semiconductor devices, as well as the aforementioned memories, employ the concept of a three-dimensional (3D) structure. Although the 3D structure concept has already been used in the field of packaging, a conventional scheme is structured such that various terminals are disposed only on a side of a semiconductor chip and signal terminals of a plurality of chips are electrically connected using wire bonding, resulting in some problems in terms of complexity of wiring and power consumption.

To overcome these problems, a through-silicon via (TSV) technique has been proposed, in which an electrode perpendicularly passing through silicon, which is a semiconductor substrate material, is formed to provide a signal transmission path.

In expectation of improvements in integration, operating speed, power consumption, and manufacturing cost of a circuit, the TSV technique has been applied to the development of a chip having a multi-processor core, and there is fierce development competition in the field of memories, such as NAND flash memories and DRAMs, and hybrid structures thereof.

FIG. 1 is a schematic diagram illustrating a 3D semiconductor device 10 stacked with TSVs.

Figure 1A:
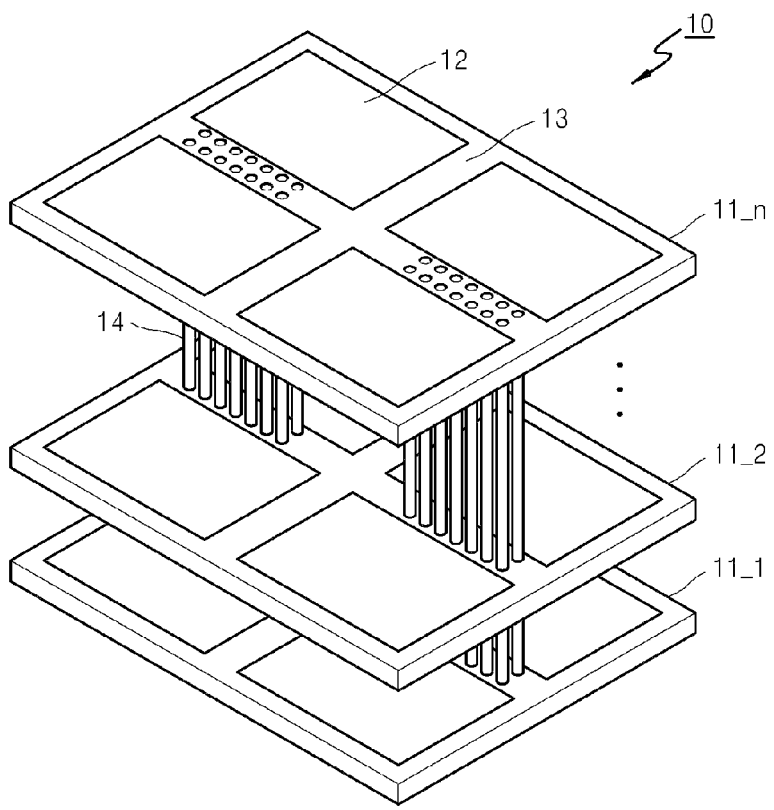
FIG. 1 is a schematic diagram illustrating a cell array structure of a three-dimensional (3D) semiconductor memory device stacked with through-silicon vias (TSVs)

Referring to FIG. 1A, the 3D semiconductor device 10 includes a plurality of layers 11_1 through 11_$n$ having a stacked structure in which the plurality of layers 11_1 through 11_$n$ are interconnected through at least one TSV 14. Each of the plurality of layers 11_1 through 11_$n$ includes a plurality of circuit blocks 12 and a periphery circuit to implement functions of the 3D semiconductor device 10. A semiconductor memory device including memory cells may be an example of the 3D semiconductor device 10, and when the 3D semiconductor device 10 illustrated in FIG. 1S is a semiconductor memory device, the plurality of layers 11_1 through 11_$n$ may be referred to as cell layers and the plurality of circuit blocks 12 may be implemented as memory blocks.

Figure 1B:
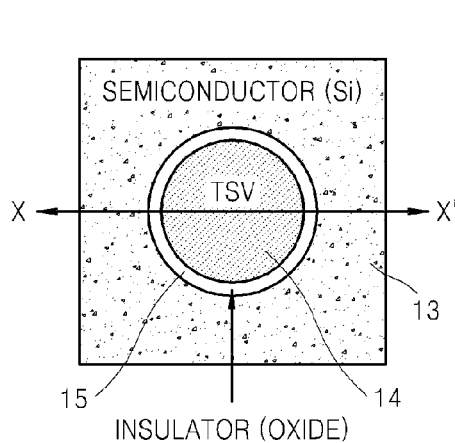
Figure 1C:
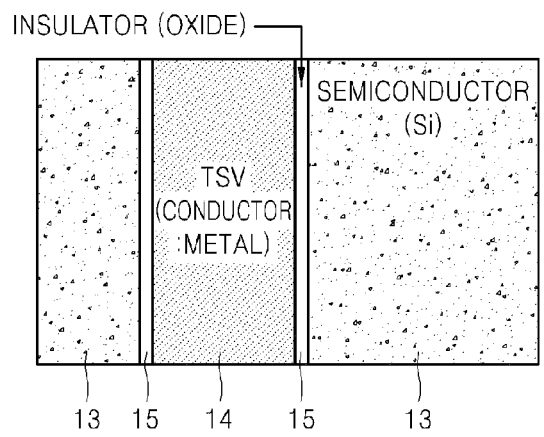

FIG. 1B shows a part of a schematic plane view including the TSV 14 in the plurality of cell layers 11_1 through 11_$n$, and FIG. 1C shows a cross-section taken along a line X-X' of FIG. 1B.

Referring to FIG. 1B, the TSV 14 composed of conductive material including metal such as copper (Cu) is disposed at the center of a silicon substrate 13 which surrounds the TSV 14. Between the TSV 14 and the silicon substrate 13 is disposed an insulator 15 for insulation therebetween.

Referring to the TSV 14 and its surrounding structure shown in FIG. 1, the TSV 14 composed of conductive material such as metal is disposed through the silicon substrate 13, with the insulator 15, such as a silicon oxide film, surrounding the TSV 14 between the TSV 14 and the silicon substrate 13, such that the TSV 14, the insulator 15, and the silicon substrate 13 form a structure of a metal-oxide-semiconductor (MOS) capacitor.

FIG. 2 is a diagram illustrating MOS capacitance characteristics in a TSV structure and an embodiment using the MOS capacitance characteristics. Hereinafter, offset signaling through a TSV according to the inventive concept will be described with reference to FIGS. 1 and 2.

As can be seen from the structure illustrated in FIG. 1, the MOS capacitor formed of the TSV 14, the insulator 15, and the silicon substrate 13 has the same characteristics as general characteristics of a MOS capacitor having a Metal-Insulator-Semiconductor (MIS) structure.

Figure 2A:
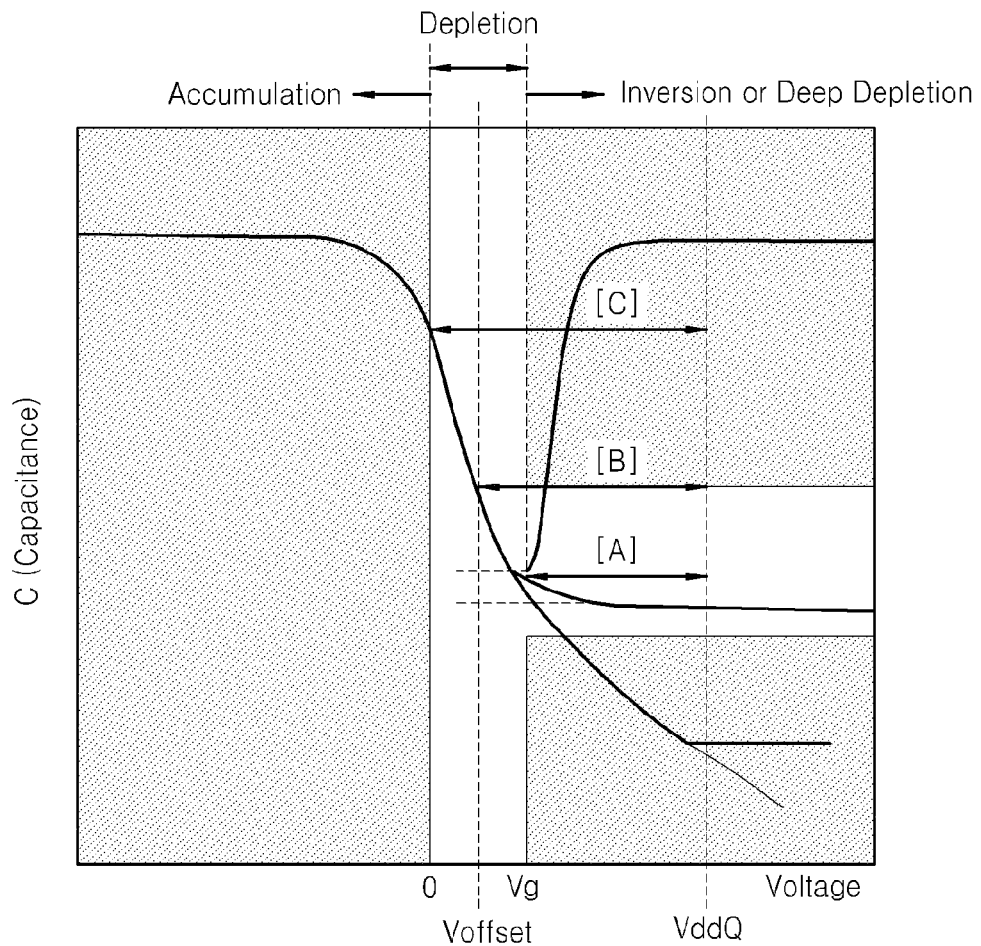
FIG. 2 is a diagram illustrating capacitance-voltage (C-V) characteristics of a metal-oxide-semiconductor (MOS) capacitance and an offset signaling operation according to an exemplary embodiment of the inventive concept.

FIG. 2A is a graph illustrating capacitance-voltage (C-V) characteristics of a MOS capacitance and an offset signaling operation according to an embodiment of the inventive concept.

Generally, a lightly doped P-type silicon substrate or a lightly doped N-type silicon substrate is used as the silicon substrate 13.

Due to the silicon substrate 13 doped as described above, carrier dynamics such as accumulation, depletion, and inversion occur in the silicon substrate 13 surrounding the insulator 15 according to polarity and level of a voltage applied to the conductive TSV 14. FIG. 2A shows a carrier forming mode which changes according to a voltage applied to a gate and a change in capacitance C according to the carrier forming mode under influence of a gate voltage and frequency in a planar MOS capacitor, which is a representative MOS structure of the TSV 14.

Referring to FIG. 2A, when a high-frequency voltage, for example, a positive voltage is applied, depletion and deep depletion modes are formed where the capacitance C has low values. Such a MOS capacitance C, that is, the capacitance C acting as a parasitic capacitance of the TSV 14 used to interconnect layers, may work as charge loss and decoupling and capacitive loading with respect to the leaky silicon substrate 13 for a signal transmitted through the TSV 14. This influence may distort and degrade a digital signal and increase power consumption. Therefore, low and constant values of the capacitance C are favorable for high-speed transmission, and the MOS capacitance C in the depletion or deep depletion mode is more favorable for signal transmission through the TSV 14.

As indicated by [C] in FIG. 2A, at full swing, like in typical complementary metal-oxide semiconductor (CMOS) digital signaling, for a 'logic low' signal having a higher value of the capacitance C than a 'logic high' signal, logic transition to digital 'logic low' is slowed down and there is more power consumption for the transition. That is, due to a sharp difference in value of capacitance C between 'logic low' and 'logic high', i.e., a balance difference between two signals, high-speed transmission is not easy to achieve.

For the foregoing reasons, in the inventive concept, for a signal transmitted through the TSV 14, low values of the capacitance C and balanced values of the capacitance C are guaranteed in both 'logic low' and 'logic high' states through biased digital signaling or offset signaling, as indicated by [A] or [B], thereby solving the foregoing problems and improving the quality of a high-speed signal transmitted through the TSV 14.

In other words, in a 3D stacked structure semiconductor device where layers are interconnected through the TSV 14, during transmission of signals having 'logic low' and 'logic high' levels through the TSV 14, offset signaling is applied to the signals such that a capacitance including the TSV 14, the semiconductor substrate, and the insulator operate in a depletion mode or a deep depletion mode. For example, when a signal transmitted through the TSV 14 is a high-frequency signal, offset signaling is applied to the high-frequency signal such that the capacitor operates in a mode where a capacitance decreases as a voltage increases.

When offset signaling is applied, the 'logic low' level of the signal is a higher level than a voltage level corresponding to a boundary between an accumulation mode and the depletion mode (voltage level corresponding to a point (e.g., an Voffset point) in the depletion mode), rather than the voltage level corresponding to the boundary. In other words, in the case of full swing through a CMOS operation, 'logic low' and 'logic high' of the signal transmitted through the TSV 14 have higher levels than a ground voltage level and thus the TSV 14 transmits a signal which swings in a range from a level of an offset voltage Voffset higher than '0V' to a level of a power voltage VDDQ.

Figure 2B:
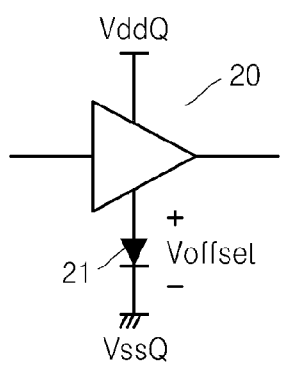
Figure 2C:
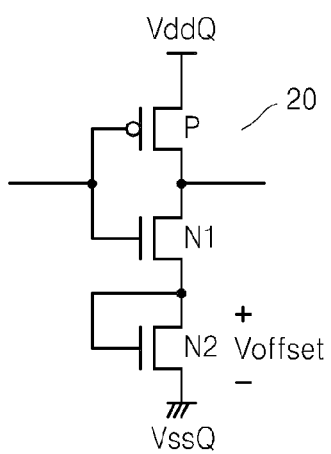

FIGS. 2B and 2C are circuit diagrams of examples of an input/output buffer for the aforementioned offset signaling. FIGS. 2B and 2C show any one of an input buffer and an output buffer included in the input/output buffer, and offset signaling according to the inventive concept may be applied to at least one of the input buffer and the output buffer.

Referring to FIG. 2B, an input/output buffer 20, which is supplied with a power voltage VddQ and a ground voltage VssQ and connected with a TSV, includes a driver circuit for driving data and an offset circuit 21 for offset signaling. When data is transmitted through the TSV, the offset circuit 21 adjusts the swing width of input/output data such that the data transmitted through the TSV fully swings from 'Voffset' that is higher than 'VssQ' to 'VddQ'. Such adjustment of the swing width is performed by the offset circuit 21 indicated by a diode symbol. That is, the input/output buffer 20 includes the offset circuit 21 connected between the driver circuit and the ground voltage VssQ.

FIG. 2C shows a push-pull driver as an example of the input/output buffer 20 shown in FIG. 2B. The push-pull driver may be implemented as an inverter, and may include, for example, a p-channel metal-oxide semiconductor (PMOS) transistor P which is connected to the power voltage VddQ to pull up the level of the input/output data and an n-channel metal-oxide semiconductor (NMOS) transistor N1 which is connected to the offset voltage Voffset, which is provided by an NMOS transistor N2 connected as a diode as an example of the offset circuit 21, to pull down the level of the input/output data to an offset level. Thus, a data signal transmitted through the TSV fully swings to a CMOS level between the offset voltage Voffset and the power voltage VddQ.

As described above, the diode-connected NMOS transistor N2 limits the swing level of the input/output buffer 20 such that full swing of data at the CMOS level is in a range between the offset voltage Voffset that is higher than the ground voltage VssQ and the power voltage VddQ.

Although signaling for input/output of data is shown in FIG. 2, it may also equally apply to signaling of a command or an address signal, as well as signaling of data.

Figure 3:
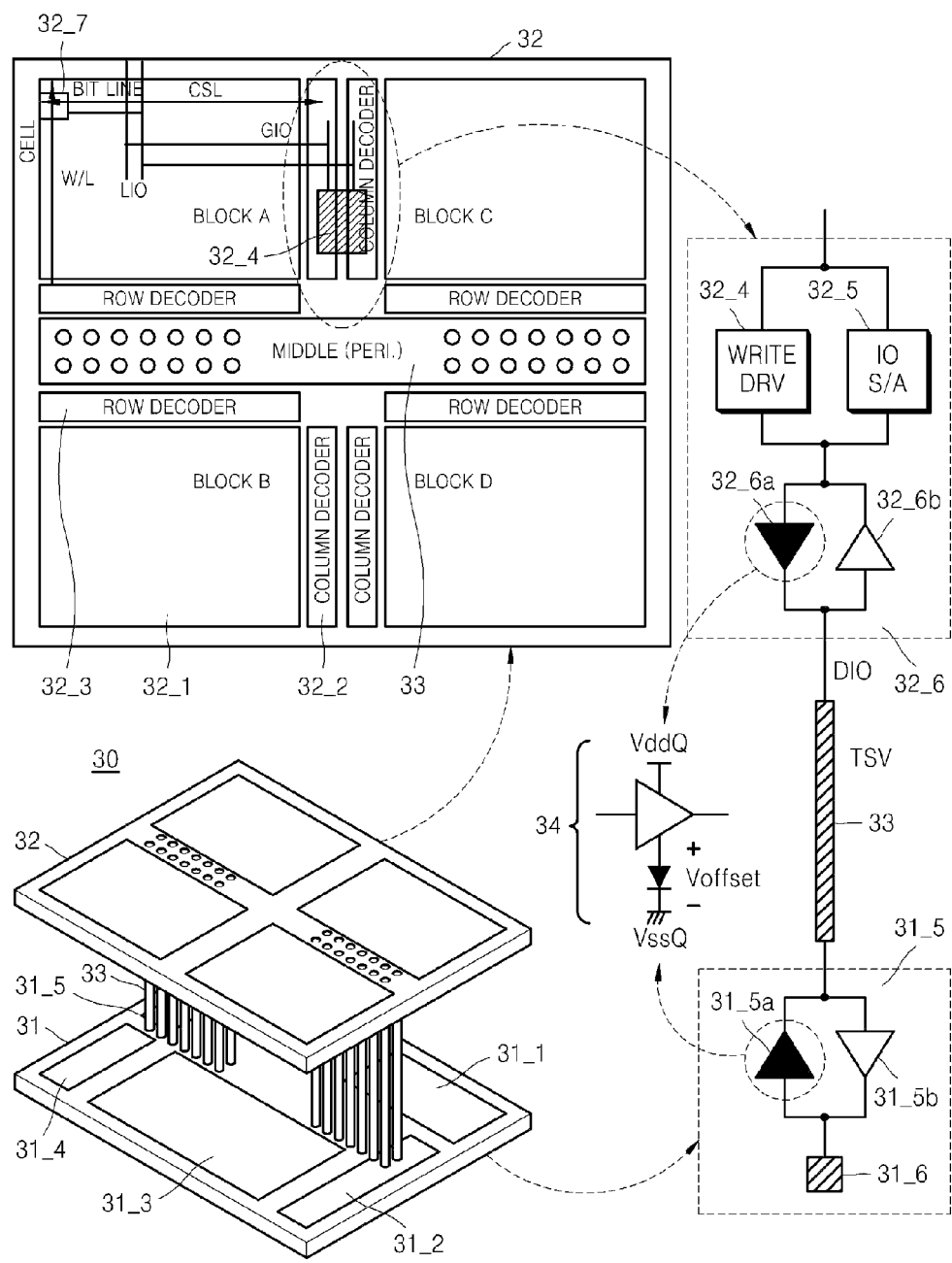
FIG. 3 is a diagram illustrating an example of offset signaling in a 3D semiconductor device having a TSV structure, according to an exemplary embodiment of the inventive concept.

FIG. 3 is a diagram illustrating an example of offset signaling in a 3D semiconductor device 30 having a TSV structure, according to an exemplary embodiment of the inventive concept.

Referring to FIG. 3, the 3D semiconductor device 30 having a TSV structure includes a DRAM chip 32 and an interface chip 31 stacked as upper and lower portions interconnected through at least one TSV 33.

The interface chip 31 that constitutes the lower portion includes an address buffer 31_4 for inputting and buffering an address from an external device (not shown), a command buffer 31_3 for inputting, buffering, and decoding a command from the external device, a input/output buffer 31_5 for inputting or outputting data, a voltage generating unit 31_1 for generating a required power voltage, and a periphery circuit 31_2 including logic for controlling overall operation of the interface chip 31.

The DRAM chip 32 that constitutes the upper portion includes a memory cell array 32_1 including a plurality of memory blocks each including a plurality of memory cells 32_7 having various structures of a single capacitor and a single transistor or a single transistor and disposed in various ways with word lines WL, bit lines BL, and sense amplifiers (not shown); a column decoder 32_2 which inputs and decodes an address and outputs a column address for selecting a column line of a respective memory block; a row decoder 32_3 which inputs and decodes an address and outputs a row address for selecting a row line of a respective memory block; a write driver 32_4; an input/output sense amplifier 32_5; and an input/output buffer 32_6.

The input/output buffer 32_6 includes an input buffer 32_6b and an output buffer 32_6a. The input/output buffer 32_6 of the upper DRAM chip 32 receives a signal from the interface chip 31 through the TSV 33 or transmits a signal to the interface chip 31 through the TSV 33. When the signal passing through the TSV 33 is a data signal, the output buffer 32_6a has to transmit a signal (e.g., read data) through the TSV 33, and to this end, the output buffer 32_6a includes an offset circuit unit 34 for the aforementioned offset signaling, such that a signal transmitted through the TSV 33 swings in a range from 'Voffset' that is higher than '0V' to the power voltage VddQ.

The interface chip 31 also includes a input/output buffer 31_5. In the 3D semiconductor device 30, a buffer for receiving a signal through a pad and delivering the signal into the 3D semiconductor device 30 may be referred to as an input buffer and a buffer for outputting a signal from the 3D semiconductor device 30 to the external device may be referred to as an output buffer. However, in light of each chip, a buffer for outputting a signal through a TSV may be referred to as an output buffer and a buffer for receiving a signal through the TSV may be referred to as an input buffer. In the following description of the inventive concept, the buffer for outputting a signal through a TSV will be referred to as an output buffer.

An output buffer 31_5a of the interface chip 31 has to transmit a signal received through a pad 31_6 (e.g., write data) to the upper DRAM chip 32 through the TSV 33, and to this end, the output buffer 31_5a includes the offset circuit unit 34 for the aforementioned offset signaling, such that a signal transmitted through the TSV 33 swings in a range from 'Voffset' that is higher than '0V' to the power voltage VddQ.

In the foregoing example, the DRAM chip 32 is stacked as a single layer, but a plurality of layers each including the DRAM chip 32 may be stacked and interconnected through the TSV 33.

The interface chip 31 may be disposed as the lowermost layer, as illustrated, between layers, or the uppermost layer. While the interface chip 31 is provided in the 3D semiconductor device 30 in FIG. 3, it may also be implemented with a package separate from the 3D semiconductor device 30. Although the 3D semiconductor device 30 includes a plurality of chips, including the interface chip 31 and the DRAM chip 32 in FIG. 3, a layer where a logic circuit for interfacing with an external device is disposed and a plurality of layers where DRAM cells are disposed respectively may be provided in a single memory chip and the layers may have a vertical stack structure.

As described with reference to FIG. 3, in the case of signal transmission/reception through the TSV 33, each chip, e.g., the interface chip 31 or the DRAM chip 32, includes an input buffer and/or output buffer connected to the TSV 33. The input buffer and the output buffer each may include a driving circuit in the form of a CMOS driving circuit disposed at the last stage, and may also include other circuits for controlling the driving circuit. In each chip, offset signaling is applied to a buffer which transmits a signal through the TSV 33 (for example, the output buffer 31_5a of the interface chip 31 and the output buffer 32_6a of the DRAM chip 32). For offset signaling, the offset circuit unit 34 shown in FIG. 3 is implemented by disposing an offset circuit (e.g., a diode) between the CMOS driving circuit and the ground voltage VssQ.

In FIG. 3, the data input/output circuit 32_6 for offset signaling is added between the write driver 32_4 for transmitting and receiving data and the input/output sense amplifier 32_5, and the TSV 33. However, the embodiment of the inventive concept is not limited to this example. For instance, the output buffer 32_6a may be included at the last stage of the input/output sense amplifier 32_5 if data from the input/output sense amplifier 32_5 is transmitted through the TSV 33, or the input buffer 32_6b may included at the first stage of the write driver 32_4 if the write driver 32_4 receives data through the TSV 33. Alternatively, if the input/output sense amplifier 32_5 includes a driver of a CMOS type at the last stage, the offset circuit (e.g., a diode) may be disposed in a driver at the last stage of the input/output sense amplifier 32_5.

Figure 4:
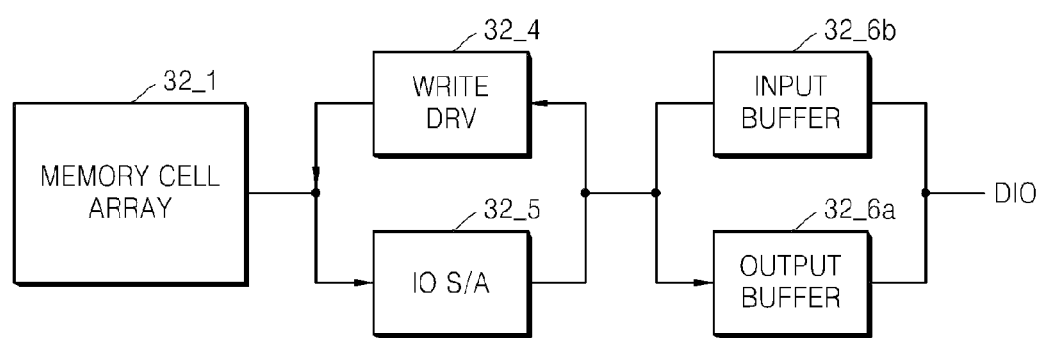
FIG. 4 is a block diagram illustrating in detail a data input/output path in a dynamic random access memory (DRAM) chip illustrated in FIG. 3, according to an exemplary embodiment of the inventive concept.

FIG. 4 is a block diagram illustrating in more detail a data input/output path in the DRAM chip 32 illustrated in FIG. 3.

Referring to FIG. 4, the data input/output path includes the memory cell array 32_1 including the plurality of memory cells 32_7; the input/output sense amplifier 32_5 (IO S/A) for sensing data output from the memory cell array 32_1 and amplifying the data to a predetermined level; the write driver 32_4 for writing input data to the memory cell array 32; a data input/output line DIO connected with the TSV (not shown); the input buffer 32_6b for inputting write data transmitted through the data input/output line DIO; and the output buffer 32_6a for providing read data provided through the input/output sense amplifier 32_5 through the data input/output line DIO. The memory cell array 32_1 includes the plurality of memory blocks illustrated in FIG. 3.

Although not shown in FIG. 4, a bit line sense amplifier, a local input/output line, a local sense amplifier, a global input/output line, and a global sense amplifier may be further provided between the memory cell array 32_1 and the input/output sense amplifier 32_5/the write driver 32_4.

The data input/output path shown in FIG. 4 may also include a multiplexer and a detailed structure and a description thereof will not be provided herein.

In the foregoing structure, in a data read operation, the output buffer 32_6a has to provide data provided from an address of the memory cell array 32_1 to a chip disposed on another layer through the data input/output line DIO and the TSV (not shown) at the next stage of the data input/output line DIO, and to this end, an offset circuit may be further provided to minimize an influence of a MOS capacitance of the TSV. The offset circuit has components shown in FIGS. 2B and 2C.

FIG. 5 shows circuit diagrams illustrating examples of a input/output buffer having an offset circuit.

FIG. 5A shows an embodiment of the input buffer 32_6b and the output buffer 32_6a illustrated in FIG. 4, and FIG. 5B shows an example where a pad 32_8 and a load adjusting unit 32_9 are included in the structure of the input buffer 32_6b and the output buffer 32_6a illustrated in FIG. 4. Although the input buffer 32_6b for receiving data is implemented with an input buffer of an inverter type in FIG. 5, the input buffer 32_6b may also be implemented with a differential amplifier including two pairs of NMOS and PMOS transistors connected in the form of a current mirror and may also be implemented in various forms. In particular, for high-speed data transmission/reception, the input buffer 32_6b is desirably implemented with the differential amplifier.

With reference to FIGS. 5A and 5B, a description will now be made of data read and write operations with respect to the memory cell array 32_1.

Referring to FIG. 5A, the output buffer 32_6a buffers output data DOB of a memory in response to an output enable signal PRB and outputs the buffered output data DOB to a data input/output signal line L1. The input/output signal line L1 is connected to the TSV (not shown). The input buffer 32_6b receives and buffers input data from the input/output signal line L1 to transmit the input data into the memory.

The output buffer 32_6a includes an OR gate 51, an inverter 52, an AND gate 53, a PMOS transistor MP1, and an NMOS transistor MN1.

The OR gate 51 performs an OR operation on the output enable signal PRB and the output data DOB. The inverter 52 inverts the output enable signal PRB. The AND gate 53 performs an AND operation on an output signal of the inverter 52 and the output data DOB. The PMOS transistor MP1 has a gate to which the output signal of the OR gate 51 is applied, a source connected to the power voltage VddQ, and a drain connected to the input/output signal line L1.

An offset circuit 55 is disposed between the NMOS transistor MN1 and the ground voltage VssQ, such that a CMOS level of output data transmitted through the data input/output signal line L1 and the TSV (not shown) at the next stage of the data input/output signal line L1 fully swings between the power voltage VddQ and the offset voltage Voffset that is higher than the ground voltage VssQ.

The input buffer 32_6b includes a PMOS transistor MP2, an NMOS transistor MN2, and an inverter 54.

The PMOS transistor MP2 has a gate for receiving input data from the input/output signal line L1 and a source connected to the power voltage VddQ. The NMOS transistor MN2 has a gate connected to the gate of the PMOS transistor MP2, a drain connected to a drain of the PMOS transistor MP2, and a source connected to the ground voltage VssQ. The inverter 54 inverts a drain voltage of the NMOS transistor MN2 and generates memory cell input data DI.

A input/output buffer shown in FIG. 5B further includes the load adjusting unit 32_9 and the pad 32_8, in addition to components of the input/output buffer shown in FIG. 5A, and thus identical components have been indicated by identical reference numerals throughout FIGS. 5A and 5B and a detailed description thereof will not be provided herein.

When the pad 32_8 is disposed in each layer in a structure where a plurality of layers are stacked with a TSV, the pad 32_8 may be used to conduct a test. In this case, the TSV is positioned at the next stage of the pad 32_8.

The load adjusting unit 32_9 adjusts a load of the input/output signal line L1 in response to the output enable signal PRB, and to this end, the load adjusting unit 32_9 includes a termination resistor Term and an NMOS transistor MN3. The termination resistor Term has a first terminal connected to the input/output signal line L1. The NMOS transistor MN3 is connected between a second terminal of the termination resistor Term and the ground voltage VssQ, and is controlled by the output enable signal PRB.

The operation of the input/output buffer having the foregoing structure will be described in association with data input/output with respect to an actual memory based on the input/output buffer illustrated in FIG. 5B. This is because, the input/output buffer illustrated in FIG. 5B also includes components illustrated in FIG. 5A and thus the description for the input/output buffer of FIG. 5B can substitute for the operation of the components illustrated in FIG. 5A.

When data is read and output from a memory cell array (not shown), the output data DOB is buffered by the output buffer 32_6a and transmitted to the pad 32_8 through the input/output signal line L1. Thereafter, the output data DOB is transmitted through the TSV (not shown), to an interface chip and then another chip set such as a memory controller (not shown), or directly to the chip set. Herein, for description's sake, transmission to the interface chip will not be described and transmission only to the chip set will be described.

When the output enable signal PRB is at 'logic low', data output from the memory cell array is transmitted to an external chip set through the pad 32_8. When the output enable signal PRB is at 'logic high', the output signal of the OR gate 51 goes to 'logic high' and the output signal of the AND gate 53 goes to 'logic low'. Thus, both the PMOS transistor MP1 and the NMOS transistor MN1 enter an OFF state. That is, when the output enable signal PRB is at 'logic high', the output data DOB of the memory is not transmitted to the pad 32_8.

When the output enable signal PRB is at 'logic low' and the output data DOB is at 'logic high', the output signal of the OR gate 51 goes to 'logic high' and the output signal of the AND gate 53 goes to 'logic high'. Thus, the PMOS transistor MP1 enters the OFF state and the NMOS transistor MN1 enters an ON state. In this case, the voltage of the input/output signal line L1 goes to 'logic low'. That is, the voltage of the input/output signal line L1 is a voltage signal in which the output data DOB is inverted.

When data is input from outside the memory to inside the memory, the data is input to the memory from the external chip set through the TSV and the pad 32_8. The input data received by the pad 32_8 is input to the input buffer 32_6b through the input/output signal line L1. The input buffer 32_6b buffers the input data and transmits the data to the memory cell array.

The load adjusting unit 32_9 adjusts the load of the input/output signal line L1 in response to the output enable signal PRB. When the output enable signal PRB is at 'logic low', that is, when data is read, the NMOS transistor MN3 enters the OFF state and the termination resistor Term does not affect the input/output signal line L1. When the output enable signal PRB is at 'logic high', that is, when data is written, the NMOS transistor MN3 enters the ON state and the termination resistor Term is connected between the input/output signal line L1 and the ground voltage VssQ.

Thus, load on the input/output signal line L1 is small when data in the memory is output, and load on the input/output signal line L1 is large when data is input from outside the memory. In other words, when data is received from outside the memory, the signal integrity of the data is improved and the waveform of the signal becomes less distorted.

Although the application example of the offset circuit for offset signaling in the input/output buffer has been described in FIGS. 4 and 5, such offset signaling may also be applied to a path of a command/address.

FIG. 6 shows block diagrams illustrating examples of offset signaling through an address path of the DRAM chip 32 illustrated in FIG. 3.

Figure 6A:
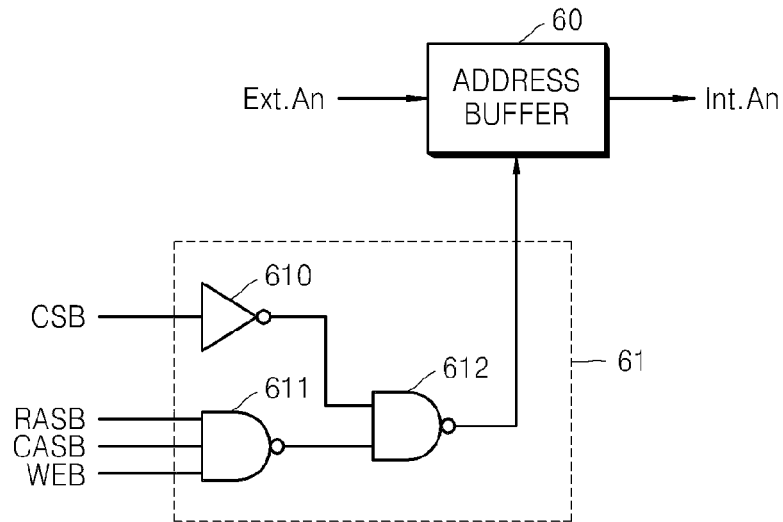
FIG. 6 shows block diagrams illustrating examples of offset signaling through an address path of the DRAM chip illustrated in FIG. 3, according to exemplary embodiments of the inventive concept.

Referring to FIG. 6A, the address path includes an address buffer 60 for receiving and buffering an external address signal Ext.An to output an internal address signal Int.An. To control transmission of an address signal through the address buffer 60, the DRAM chip 32 further includes an address buffer controller 61. The address buffer controller 61 includes an inverter 610, a first NAND gate 611, and a second NAND gate 612.

Memory control signals, including a chip selection signal CSB, a row address signal RASB, a column address strobe CASB, and a write enable signal WEB, are provided as commands in various forms through logic combinations thereof to a memory device.

The memory control signals may include at least two selected from a group consisting of the chip selection signal CSB, the row address signal RASB, the column address strobe CASB, and the write enable signal WEB.

The inverter 610 inverts the chip selection signal CSB. The first NAND gate 611 receives a memory control signal and performs a NAND operation. Although the first NAND gate 611 is implemented with a NAND gate, the first NAND gate 611 may also be implemented with an AND gate and an inverter or a NOR gate and an inverter. That is, any gate can be used as long as the gate receives the memory control signal and outputs a NAND operation result.

The second NAND gate 612 receives an output signal of the inverter 610 and an output signal of the first NAND gate 611 and performs a NAND operation, and an output signal of the second NAND gate 612 controls the address buffer 60.

Herein, the NAND operation result of the second NAND gate 612 is an operation control signal where the second NAND gate 612 generates an operation control signal in a second state during a non-operation period where a semiconductor memory device does not perform a data accessing operation and generates an operation control signal in a first state during an operation period where the semiconductor memory device performs the data accessing operation.

Such an operating process of the address buffer controller 61 may be briefly described in Table 1.

TABLE 1

| CSB | RASB | CASB | WEB | First NAND | Second NAND |
|---|---|---|---|---|---|
| 0 | 1 | 1 | 1 | 0 | 1 |
| 1 | X | X | X | X | 1 |

In Table 1, "0" and "1" are logic values and 'X' indicates a 'Don't Care' state where a logic value may be any one of "0" and "1".

As can be seen from Table 1, for the chip selection signal CSB having a logic value "1", regardless of the NAND operation result of the first NAND gate 611, the NAND operation result of the second NAND gate 612 is "1" due to characteristics of the NAND operation, such that the address buffer 60 is disabled.

By doing so, an output signal of the address buffer 60, i.e., the internal address signal Int.An, is not output during the non-operation period, thereby reducing power consumption.

Figure 6B:
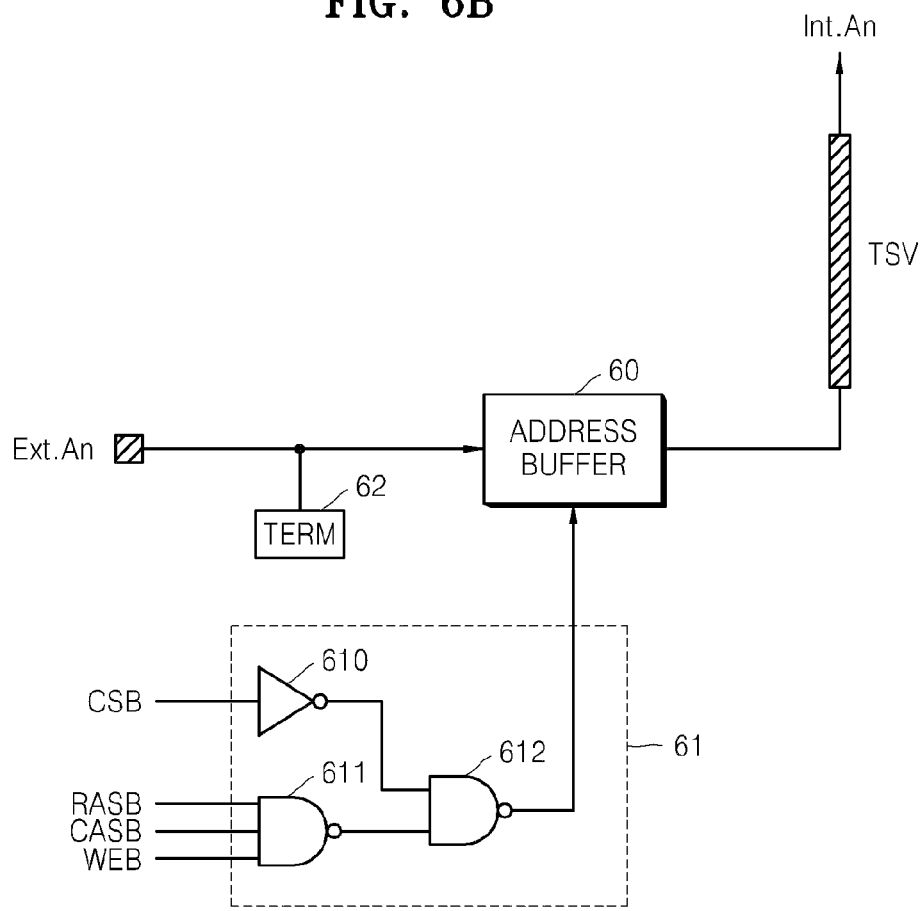

FIG. 6B illustrates an example where the load adjusting unit 62 is disposed at an input terminal of the address buffer 60. As described with reference to FIG. 5B, signal integrity can be improved by providing a load to the input/output signal line (The input/output line L1 in FIG. 5 or the input/output line DIO in FIG. 4?), and the load adjusting unit 62 for this end may be disposed at an input terminal for an address as shown in FIG. 6B in a similar manner to a structure where the load adjusting unit 62 is disposed at an input terminal for data. The address buffer 60 may be provided in the interface chip 31 illustrated in FIG. 3, and receives the external address signal Ext.An from an external device through a pad of the interface chip 31, buffers the external address signal Ext.An, generates the internal address signal Int.An as the buffered address, and provides the internal address signal Int.An to the DRAM chip 32 through the TSV. Since the address buffer 60 applies offset signaling in the generation of the internal address signal Int.An, the internal address signal Int.An has a voltage level which fully swings between the power voltage Vdd and the offset voltage Voffset.

The load adjusting unit 62 may be included as a termination resistor in the 3D semiconductor device 30. When the address buffer 60 is included in the interface chip 31, the load adjusting unit 62 is connected to an input terminal of the address buffer 60 of the interface chip 31. When the load adjusting unit 62 is applied to the address buffer 60, the load adjusting unit 62 may be disposed in a module termination form outside the 3D semiconductor device 30. For example, in a memory module (not shown) where a plurality of 3D semiconductor devices 30 are mounted, the memory module may include an address transmission line (not shown) for transmitting an address to the 3D semiconductor devices 30, and the load adjusting unit 62 may be connected to the address transmission line.

Figure 7:
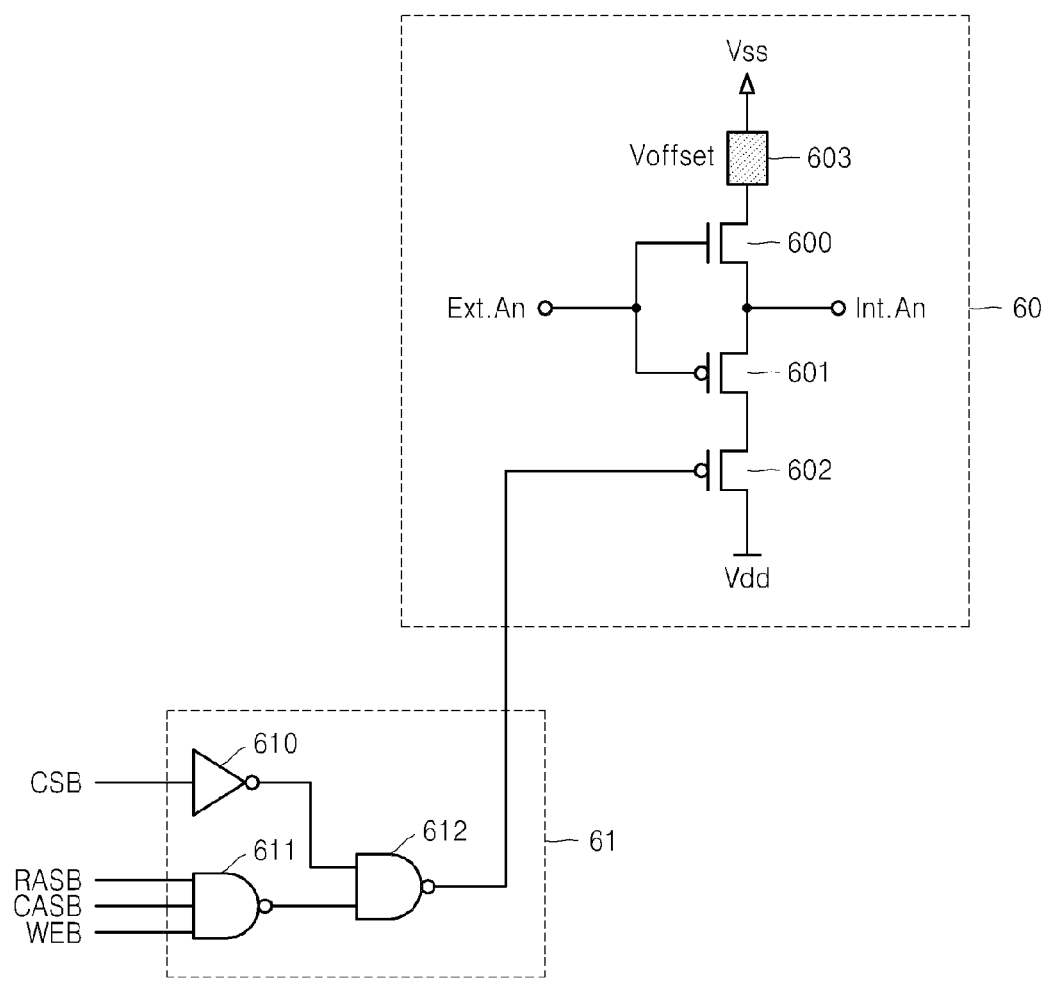
FIG. 7 is a circuit diagram illustrating an example in which an offset circuit is applied to the address path illustrated in FIG. 6, according to an exemplary embodiment of the inventive concept.

FIG. 7 is a diagram equivalently illustrating an example where an offset circuit 603 according to the inventive concept is applied to the address buffer 60 in the address path illustrated in FIG. 6. For convenience's sake, the operation of the address buffer 60 illustrated in FIG. 6A will be used as an example.

Referring to FIG. 7, the address buffer 60 includes a CMOS inverter including an NMOS transistor 600 and a PMOS transistor 601; a PMOS transistor 602 (hereinafter, will be referred to as an access transistor) which is connected between the CMOS inverter and the power voltage Vdd and has a gate controlled by an output of the address buffer controller 61, and the offset circuit 603 which is interposed between the CMOS inverter and the ground voltage Vss to perform offset signaling on the internal address signal Int.An provided through the TSV (not shown).

Hereinafter, referring to Table 1 and FIG. 7, a description will be made of an operation in which the address buffer 60 is controlled by the address buffer controller 61 during the non-operation period of a 3D semiconductor memory device.

When the non-operation period is activated by a memory control signal, that is, when the output of the second NAND gate 612 is "1", the access transistor 602 is turned off, such that the power voltage Vdd is not provided to the CMOS inverter.

In this case, in spite of reception of the external address signal Ext.An, the internal address signal Int.An is not output due to deactivation of the address buffer 60. That is, the address buffer controller 61 deactivates the address buffer 60 when the result based on the memory control signal corresponds to the non-operation period, as in Table 1.

The address buffer 60 shown in FIG. 7 can be implemented with a differential amplifier including two pairs of NMOS and PMOS transistors connected in the form of a current mirror, and can also be implemented in various forms.

Figure 8:
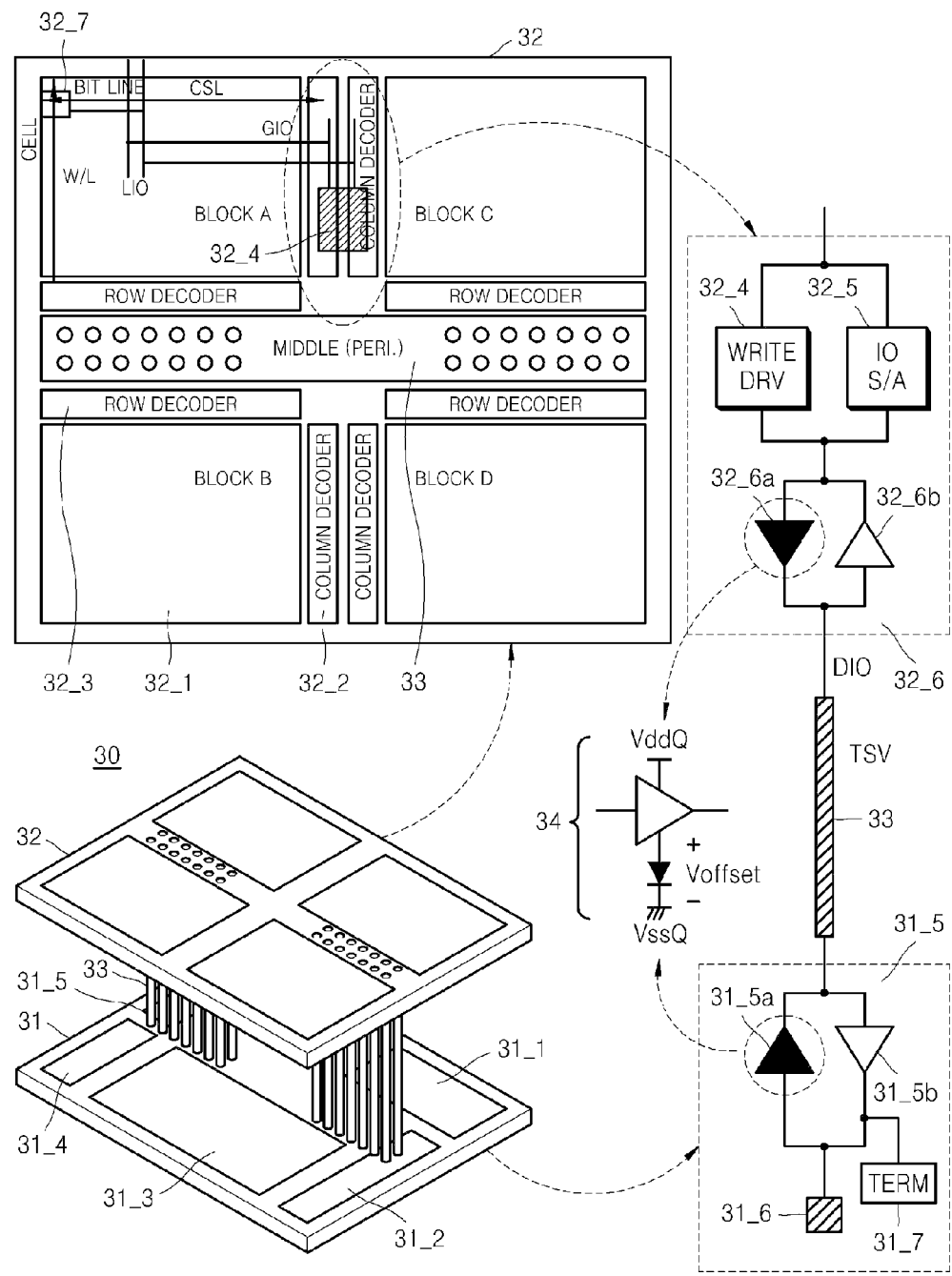
FIGS. 8 and 9 are diagrams illustrating an embodiment modified from the example illustrated in FIG. 3.

FIG. 8 is a diagram illustrating a modified embodiment of FIG. 3 in which the interface chip 31 includes a load adjusting unit 31_7 proposed in FIG. 5B between the output buffer 31_5a and the pad 31_6.

Once a data read command is generated from the interface chip 31 or a memory controller provided separately as an external chip set, the load adjusting unit 317 is turned off and thus does not affect the data input/output line (DIO). Upon generation of a data write command, the load adjusting unit 31_7 is turned on and thus provides a load to the data input/output line (DIO), thereby improving signal integrity.

The load adjusting unit 31_7 can be implemented in various forms such as a mother board termination (MBT) form, a module termination (MT) form, an on die termination (ODT) form, etc.

The load adjusting unit 317 may also be implemented with various voltage levels such as a center tap termination (CTT), a power voltage termination (VddQ termination), or a ground voltage termination (VssQ termination).

Also in the embodiment shown in FIG. 8, the interface chip 31 includes the input/output buffer 31_5 for transmitting a signal to or receiving a signal from the TSV 33, and the DRAM chip 32 includes the input/output buffer 32_6 for transmitting a signal to or receiving a signal from the TSV 33. Offset signaling is applied to the output buffer 31_5a of the interface chip 31 and the output buffer 32_6a of the DRAM chip 32. If the load adjusting unit 31_7 is connected to an input terminal of the output buffer 31_5a of the interface chip 31, the voltage level of the input terminal of the output buffer 31_5a may be changed according to the load disposition form of the load adjusting unit 31_7 (e.g., a CTT, a VddQ termination, or a VssQ termination), and in this case, the level of the offset voltage Voffset based on offset signaling may also be changed.

In FIG. 8, components which are identical to those shown in FIG. 3 have been indicated by identical reference numerals and structures and detailed operations thereof will not be described.

Figure 9:
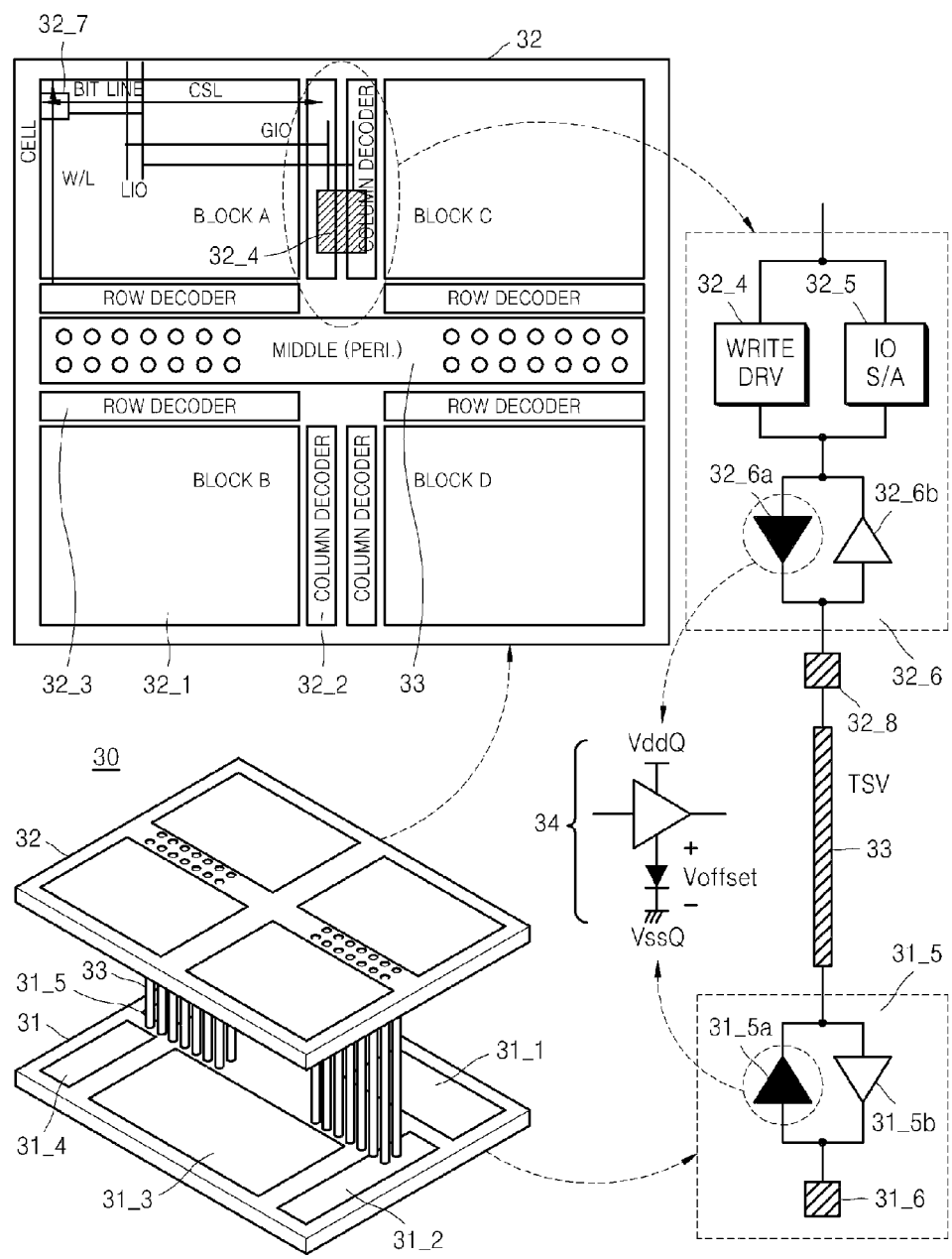

FIG. 9 is a diagram illustrating another modified embodiment of FIG. 3 in which the DRAM chip 32 includes the pad 32_8 illustrated in FIG. 5B and the input/output buffer 32_6 of the DRAM chip 32 interfaces data with the interface chip 31 through the pad 32_8 and the TSV 33. A load adjusting unit is included in FIG. 5B, but not in FIG. 9.

Figure 10:
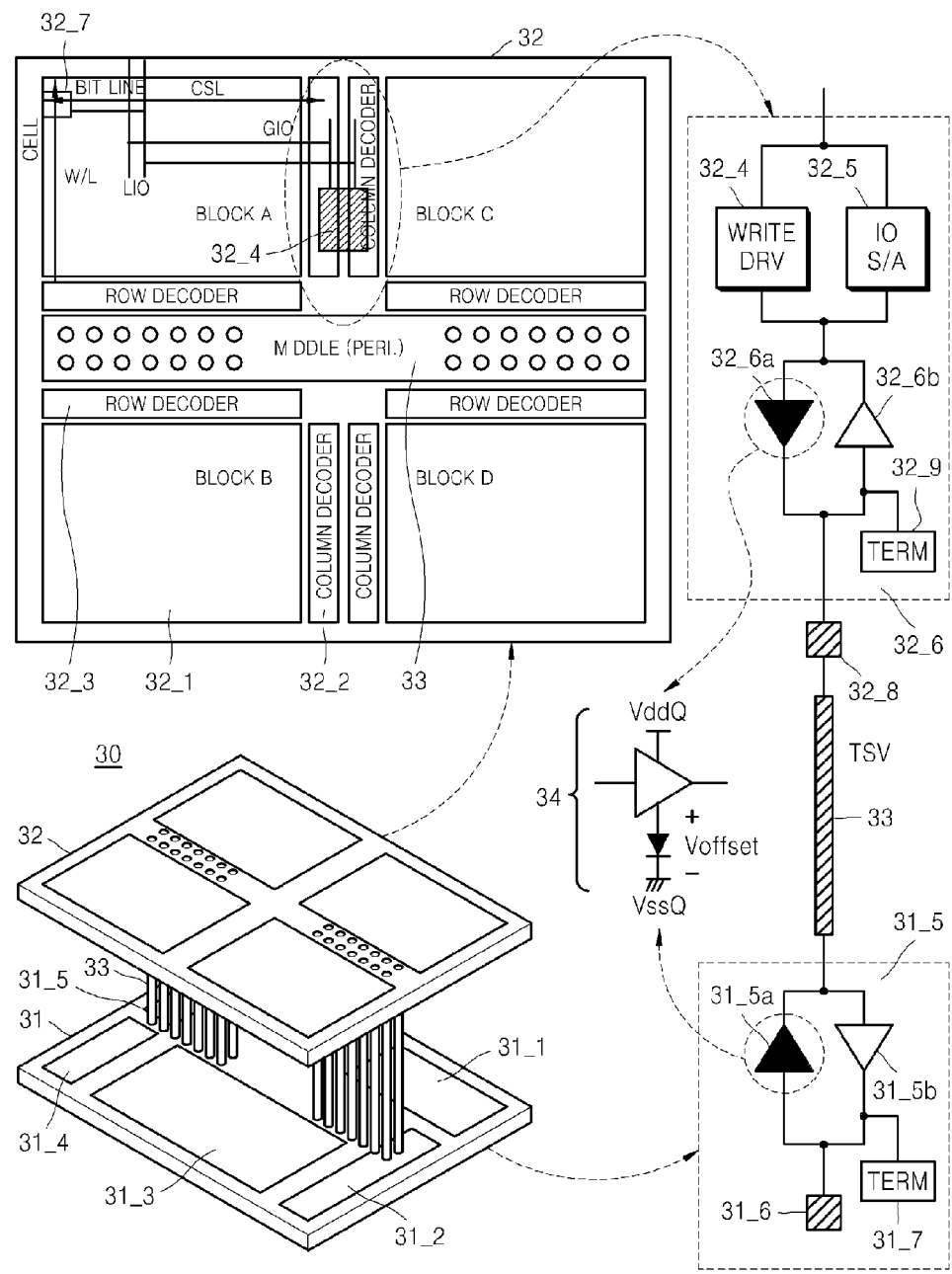
FIG. 10 is a diagram illustrating an embodiment modified from the embodiment illustrated in FIG. 9, in which a load adjusting unit is further provided in the input/output buffer.

FIG. 10 is a diagram illustrating a modified embodiment of FIG. 9 in which the input/output buffer 32_6 further includes a load adjusting unit 32_9.

FIGS. 9 and 10 include identical components to those described in FIG. 3 and FIGS. 5A and 5B, which are also indicated by identical reference numerals, and thus such components will not be described repetitively.

Figure 11:
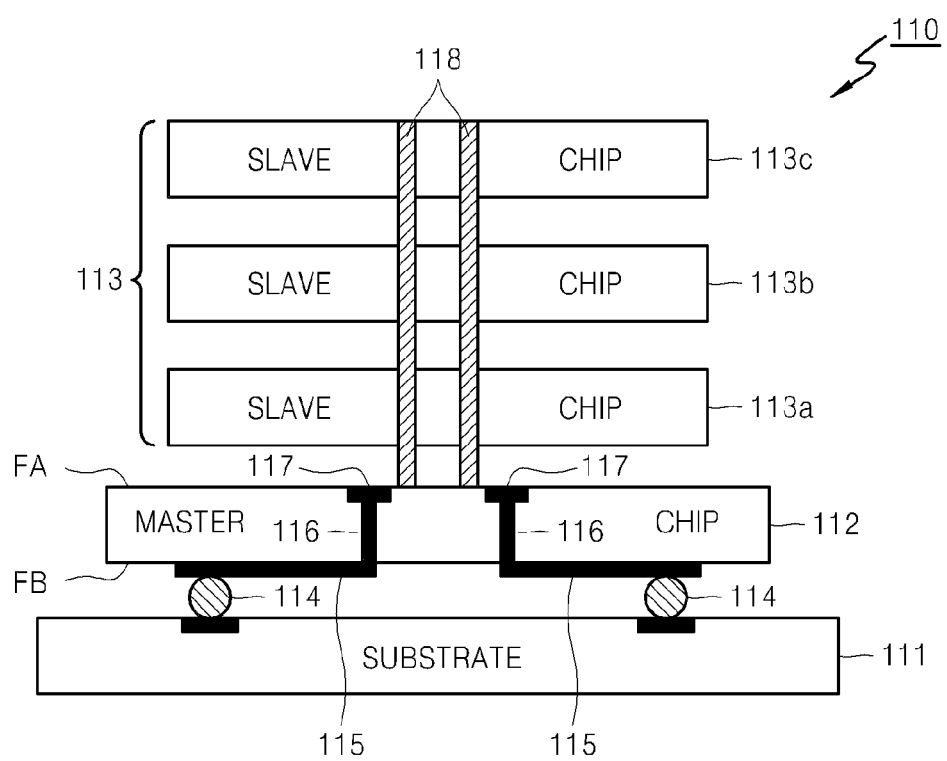
FIG. 11 is a cross-sectional view illustrating a stacked memory device according to another exemplary embodiment of the inventive concept.

FIG. 11 is a cross-sectional view illustrating a structure of a stacked memory device 110 according to another embodiment of the inventive concept.

Referring to FIG. 11, the stacked memory device 110 includes a master chip 112 and slave chips 113a through 113c. The master chip 112 includes on a first surface FA thereof a first input/output circuit (not shown) for interfacing with outside a memory device and a first memory core (not shown). The slave chips 113a through 113c are electrically interconnected through first TSVs 118, and are electrically connected to the master chip 112 through the first TSVs 118. The master chip 112 and the slave chips 113a through 113c transmit and receive data and control signals such as command/address signals through the first TSVs 118. The stacked memory device 110 may further include a substrate 111 electrically connected to the master chip 112. The stacked memory device 110 may further include first internal electrodes 117, second TSVs 116, second internal electrodes 115, and external terminals 114.

The first internal electrodes 117 are disposed in the first surface FA of the master chip 112. The second TSVs 116 electrically interconnect the first surface FA of the master chip 112 with a second surface FB of the master chip 112. The second internal electrodes 115 are disposed on the second surface FB of the master chip 112, and are electrically connected to the first internal electrodes 117, respectively. The external terminals 114 electrically connect the second internal electrodes 115 with the substrate 111.

In the stacked memory device 110 structured as shown in FIG. 11, the slave chips 113a through 113c positioned at an upper portion have memory cores including memory cell arrays and input/output buffers, whereas the master chip 112 positioned at a lower portion further includes a circuit for interfacing with an external device, a control circuit, and a peripheral circuit as well as the memory core.

FIGS. 12A through 14 are a simplified perspective view of the stacked memory device 110 of FIG. 11 and diagrams illustrating various modifications of the stacked memory device 110. Hereinafter, various application examples according to the inventive concept will be described with reference to FIGS. 12A through 14.

Although TSVs 118a through 118c each are arranged in a line in examples shown in FIGS. 12A through 14, the stacked memory device 110 may have the TSVs 118a through 118c which are arranged in two lines as illustrated in FIG. 11 or more lines.

In addition, in the examples shown in FIGS. 12A through 14, offset signaling is applied to a data input/output path for data transmission through a TSV, but offset signaling may also be applied to a path of other signals, such as commands or addresses.

Figure 12A:
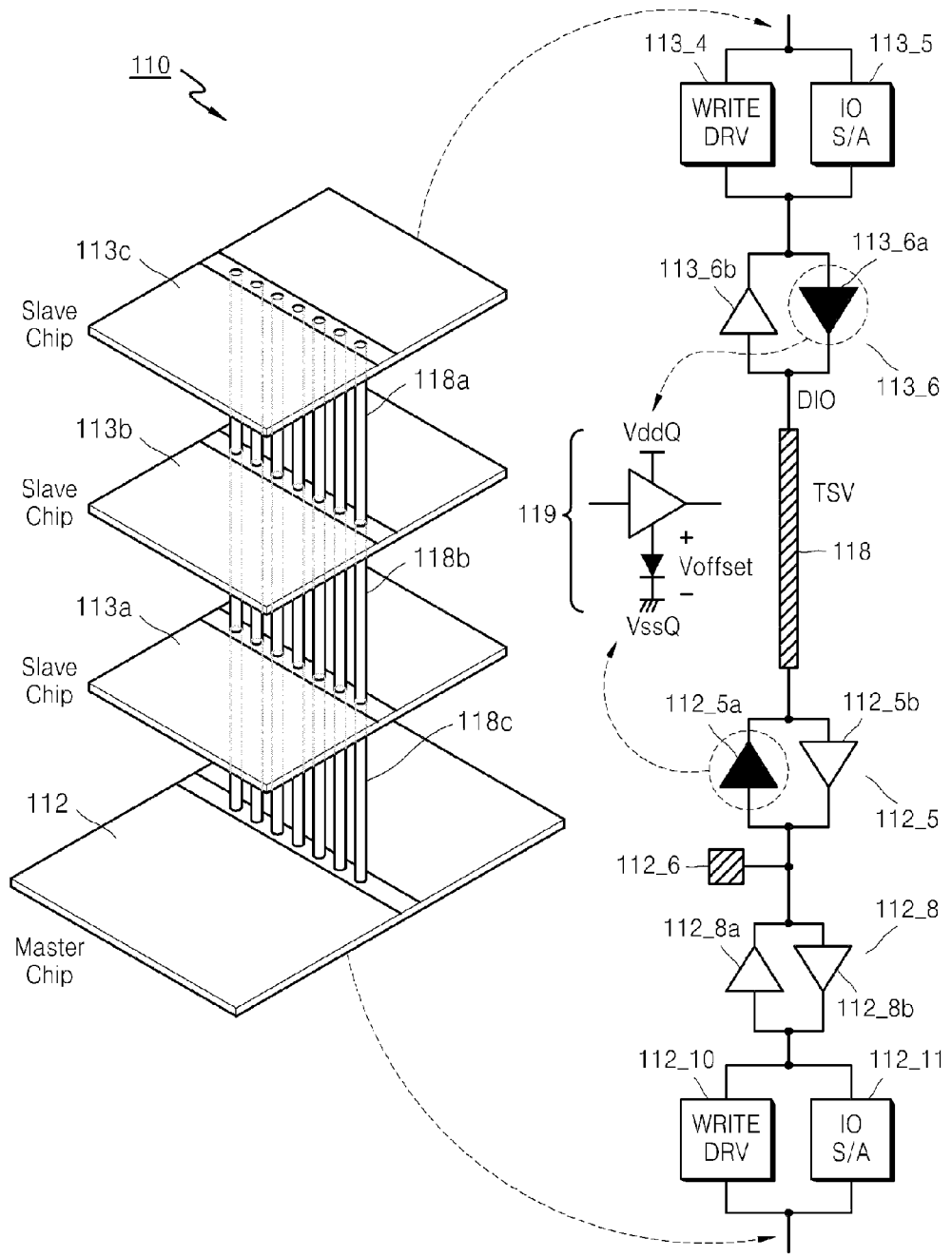
FIGS. 12A through 14 are diagrams illustrating various modifications of the stacked memory device illustrated in FIG. 11.

Referring to FIG. 12A, the stacked memory device 110 includes the master chip 112 and the slave chips 113a through 113c which are electrically connected by the TSVs 118a through 118c.

On the assumption that the slave chips 113a through 113c are DRAM chips, each of the slave chips 113a through 113c includes a memory cell array including a plurality of memory blocks (not shown) each including a plurality of memory cells (not shown) having various structures of a single capacitor and a single transistor or a single transistor and disposed in various ways with word lines, bit lines, and sense amplifiers (not shown); a column decoder adjacent to a respective memory block; a row decoder adjacent to a respective memory block; a write driver 113_4; an input/output sense amplifier 113_5; and an input/output buffer 113_6.

The input/output buffer 113_6 includes an input buffer 113_6b and an output buffer 113_6a. The output buffer 113_6a has to transmit a data signal through a TSV 118, and to this end, the output buffer 113_6a includes an offset circuit 119 for offset signaling, such that a signal transmitted through the TSV 118 fully swings from "Voffset" that is higher than "0V" to the CMOS level of the power voltage VddQ.

An input/output buffer 112_5 positioned on the master chip 112 for data input includes an output buffer 112_5a and an input buffer 112_5b. Since the output buffer 112_5a has to transmit a data signal to the slave chips 113a through 113c through the TSV 118, the offset circuit 119 is further included for offset signaling, such that a signal transmitted through the TSV 118 fully swings from "Voffset" that is higher than "0V" to the CMOS level of the power voltage VddQ.

For a data signal output from or input to the memory core of the master chip 112, the master chip 112 may also include a write driver 112_10, an input/output sense amplifier 112_11, and an input/output buffer 112_8.

The input/output buffer 112_8 includes an input buffer 112_8b and an output buffer 112_8a. The input buffer 112_8b and the output buffer 112_8a do not transmit a data signal through the TSV 118, and thus they do not need to include the offset circuit 119 for offset signaling. Therefore, a data signal output from the input buffer 112_8b or the output buffer 112_8a fully swings from "0V" to the CMOS level of the power voltage VddQ. The input/output buffers 112_5 and 112_8 are connected to a pad 112_6.

In the example shown in FIG. 12A, the master chip 112 is structured such that the input/output buffer 112_8 for data input to or data output from the memory core of the master chip 112 and the input/output buffer 112_5 for data input to or data output from the slave chips 113a through 113c are separated from each other, and thus may have structures different from each other. For example, the input/output buffer 112_5 for data input to or data output from the slave chips 113a through 113c may include the offset circuit 119 for offset signaling through the TSV 118, whereas the input/output buffer 112_8 for data input to or data output from the memory core of the master chip 112 may not include the offset circuit 119.

Although identical slave chips 113a through 113c are stacked herein, a plurality of different memories or different kinds of chips may be stacked and may be connected by TSVs and other connection means, e.g., wire bonding.

The master chip 112 may be disposed as the lowermost layer, as illustrated, between layers, or the uppermost layer. Although the master chip 112 is included in the stacked memory device 110 in FIG. 12A, the master chip 112 may also be implemented with a package separated from the stacked memory device 110.

Figure 12B:
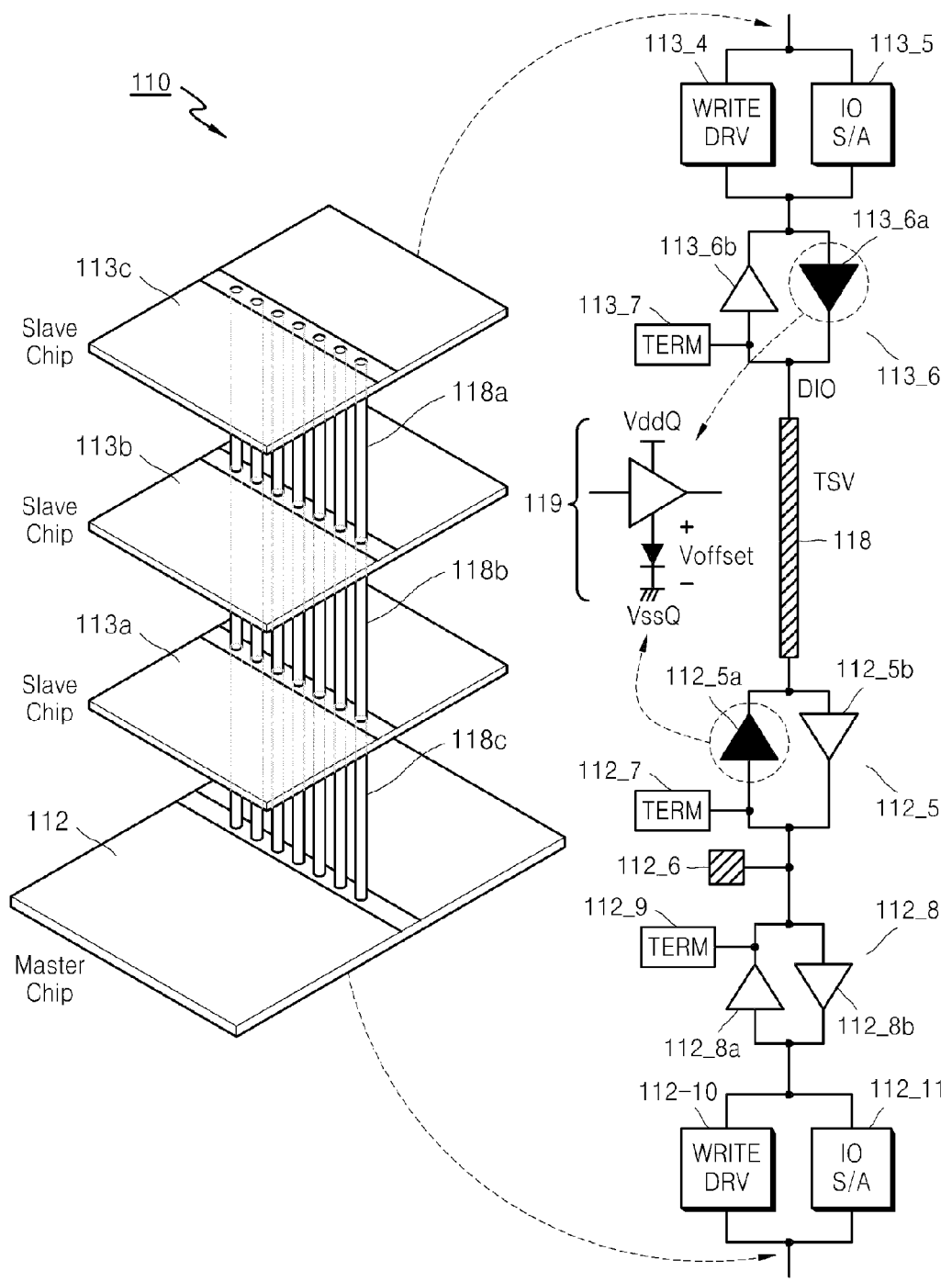

In FIG. 12B, to improve signal integrity, the master chip 112 and the slave chips 113a through 113c further include loading adjusting units 112_7, 112_9, and 113_7 connected to the input/output buffers 113_6, 112_5, and 112_8, respectively, in addition to components shown in FIG. 12A. Although the loading adjusting units 112_7, 112_9, and 113_7 are implemented as ODTs disposed in the master chip 112 in FIG. 13, they may also be implemented in other forms. The stacked memory device 110 shown in FIG. 13 has the same components as those of the stacked memory device 110 illustrated in FIG. 12 except for the loading adjusting units 112_7, 112_9, and 113_7, and thus such components and operations thereof will not be described in detail.

Figure 13:
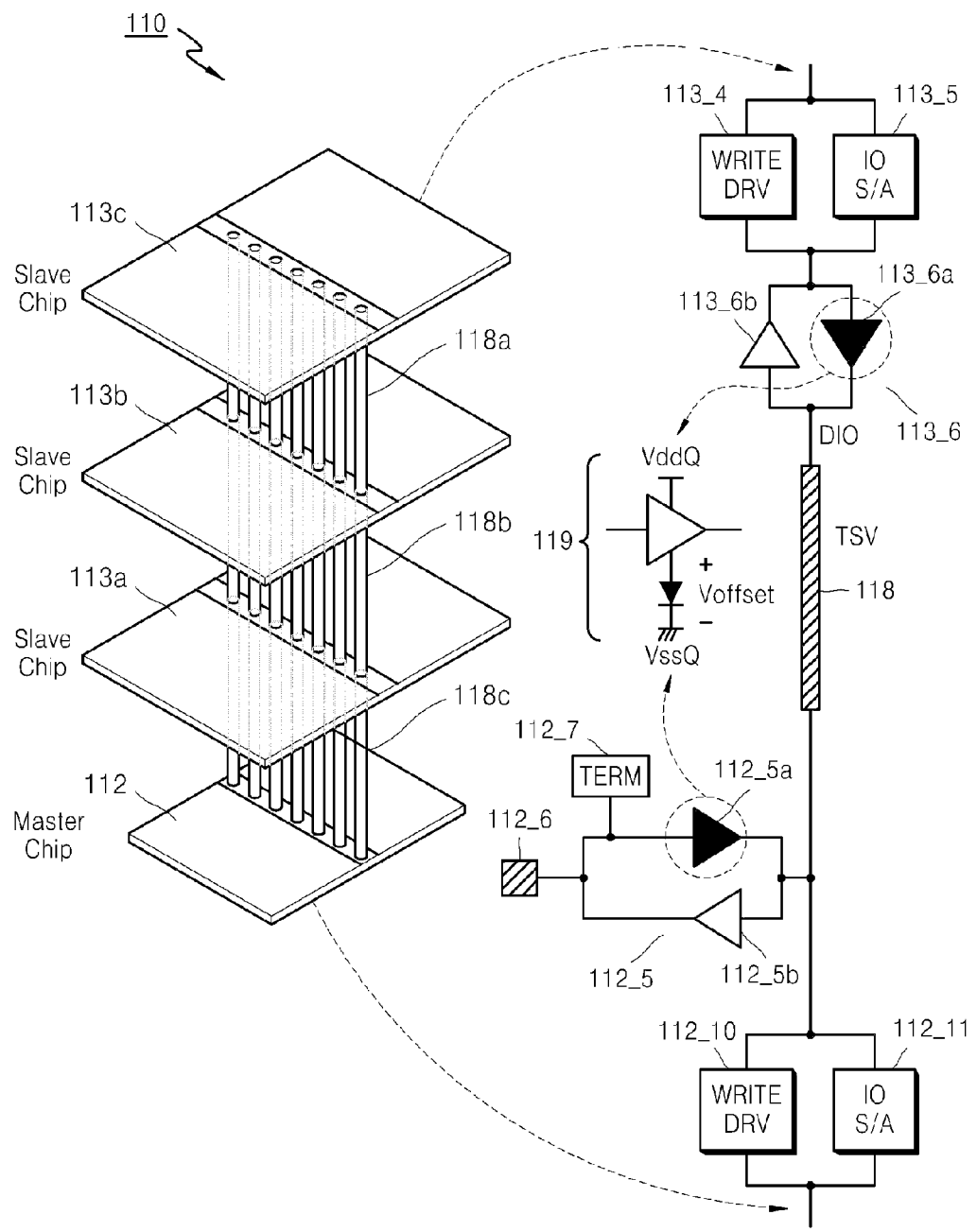
Figure 14:
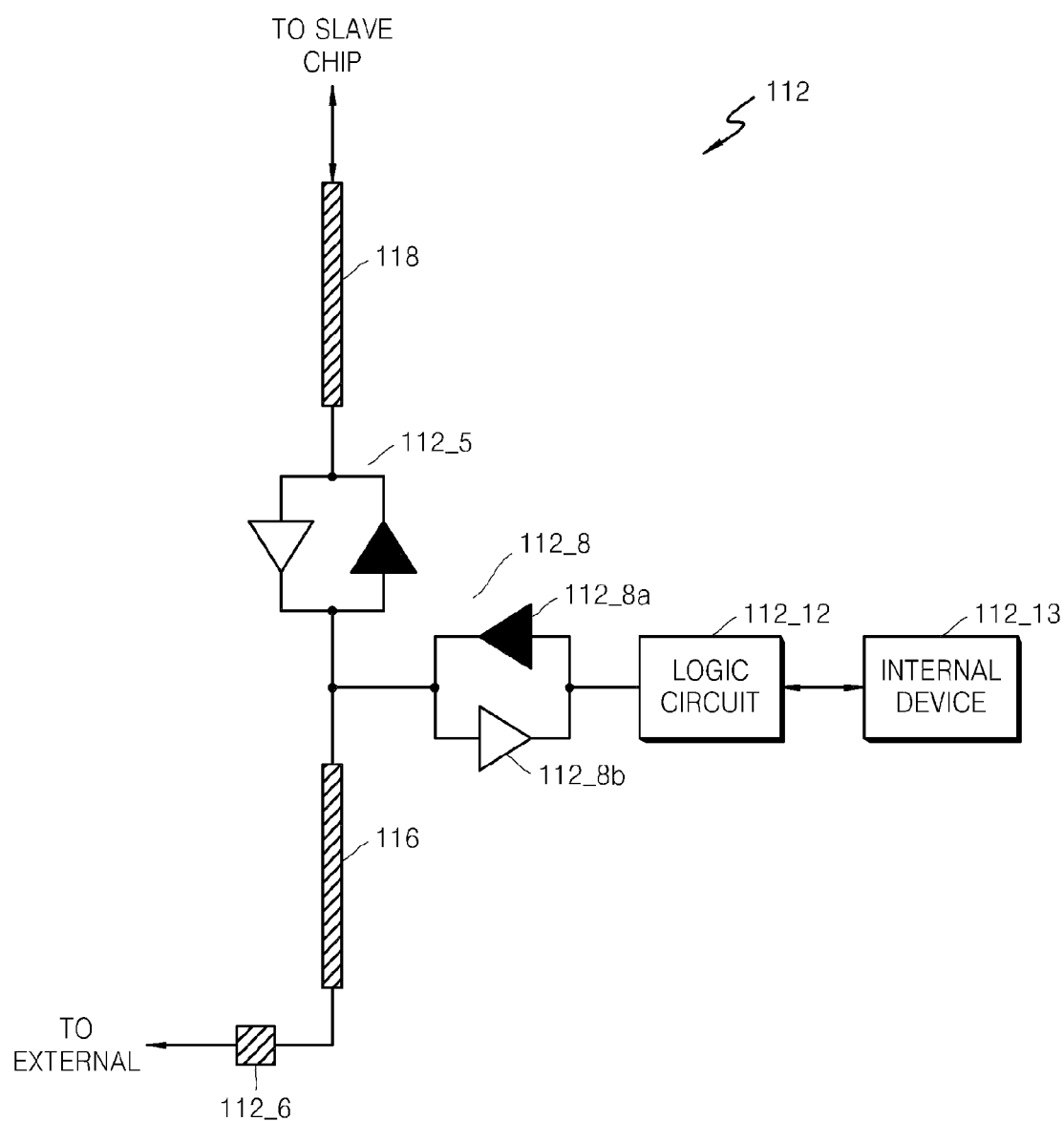

Unlike in FIGS. 12A and 12B, in FIG. 13, an input/output buffer for data input to or output from the slave chips 113a through 113c may be shared with an input/output buffer for data input to or data output from the memory core of the master chip 112.

Also in FIG. 13, the same components as those shown in FIGS. 12A and 12B will be indicated by the same reference numerals and will not be described in detail.

As the input/output buffer 112_5 for data input to or data output from the memory cores of the slave chips 113a through 113c and for data input to or output from the memory core of the master chip 112 is shared, the input/output buffer 112_5 needs the offset circuit 119 for offset signaling through the TSV 118 and thus the shared input/output buffer 112_5 has the offset circuit 119 for offset signaling through the TSV 118.

Offset signaling of the shared input/output buffer 112_5 may be on/off controlled according to a layer to or from which data is input or output. For example, when data is transmitted to the memory core of the master chip 112, the offset circuit 119 of the output buffer 112_5a is turned off such that data can fully swing from the ground voltage VssQ to the power voltage VddQ. On the other hand, to transmit data to the memory cores of the slave chips 113a through 113c, the data has to be transmitted through the TSV 118 and thus the offset circuit 119 of the output buffer 112_5a is turned on, such that the data can fully swing from the offset voltage Voffset that is higher than the ground voltage VssQ to the power voltage VddQ.

The input/output buffer 112_5 may also perform offset signaling at all times, regardless of on-off control of the offset circuit 119.

In FIGS. 12A through 13, different input/output buffers are used for data input to or output from the memory core of the master chip 112 and data input to or output from the memory cores of the slave chips 113a through 113c, and data is transmitted or received using a shared input/output buffer. In addition, features regarding a load adjusting unit which is connected to each input/output buffer are described in FIGS. 12A through 13. Although not shown in FIGS. 12A through 13, an embodiment is also possible where the load adjusting unit 112_7 is not connected to the shared input/output buffer 112_5 shown in FIG. 13.

With reference to FIGS. 12A through 13, the characteristics of signal transmission through the TSV 118 in the memory device 110 have been described. In particular, signal transmission through the TSV 118 between the master chip 112 and the slave chips 113a through 113c has been described with reference to FIGS. 12A through 13, but the master chip 112 can also transmit a signal to an external device through a TSV (116 of FIG. 14). Therefore, with reference to FIG. 14, a description will be made of an embodiment where offset signaling is applied to signal transmission to the external device.

When a logic circuit 112_12 is disposed on the first surface FA of the master chip 112 and a pad for interfacing with an external device is disposed on the second surface FB, an output signal from the master chip 112 to the external device is provided to the external device through the TSV 116 and the pad of the second surface FB. Among components shown in FIG. 14, the input/output buffer 112_8 is a buffer for transmitting a signal to or receiving a signal from the master chip 112 and the logic circuit 112_12 and an internal device 112_13 transmit a signal to and receive a signal from the external device through the input/output buffer 112_8 and the TSV 116. When a memory core is disposed in the master chip 112, as in FIGS. 12A through 13, the logic circuit 112_12 may be a peripheral circuit including an input/output sense amplifier and a write driver and the internal device 112_13 may be the memory core. The operation of the input/output buffer 112_5 for signal transmission to or reception from the slave chips 113a through 113c has already been described and thus will not be described in detail.

The input/output buffer 112_8 for signal transmission to or reception from the internal device 112_13 of the master chip 112 receives an input signal through the TSV 116 and transmits the signal to the logic circuit 112_12 and the internal device 112_13. An output signal generated from the internal device 112_13 is transmitted to the external device through the logic circuit 112_12, the input/output buffer 112_8, and then the TSV 116. Since the input/output buffer 112_8 generates an output signal transmitted through the TSV 116, offset signaling is applied to the input/output buffer 112_8. By applying offset signaling to the output buffer 112_8a which transmits the output signal through the TSV 116, a first logic level (low level) of the signal transmitted through the TSV 116 goes to the offset voltage Voffset.

As described above, in transmission of signals such as data, addresses, commands, etc. through a TSV, that is, in signaling, an offset of a predetermined level is provided.

An offset may be previously set at a release stage of a product in units of a chip or package, or may be set by a user, and may be reset during use of the product.

Hereinafter, a process of setting or calibrating an offset will be described.

Figure 15:
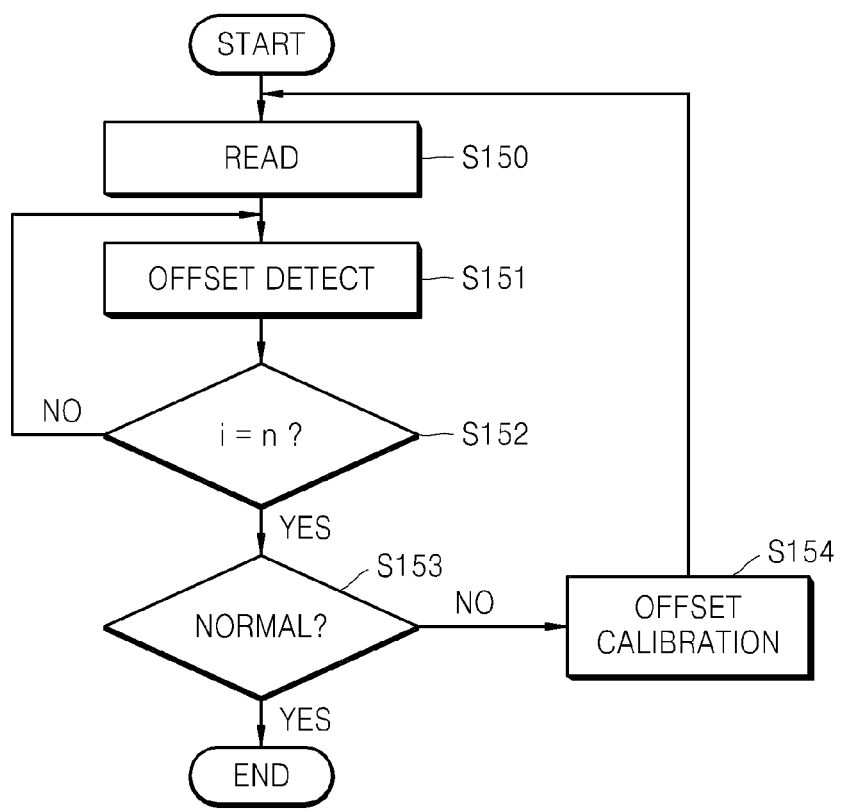
FIG. 15 is a flowchart schematically illustrating an offset calibration process for offset signaling, according to an exemplary embodiment of the inventive concept.

FIG. 15 is a flowchart schematically illustrating an offset calibration process for offset signaling, according to an embodiment of the inventive concept.

Offset circuits are disposed in a chip as many as the same number as or a number proportional to the number of input/output buffers, and some characteristic variation may occur in manufacturing processes. Thus, different offsets for different input/output buffers for the same signal may distort the signal.

To this end, calibration for setting an offset for each input/output buffer to be in a predetermined range is required. Calibration may be performed in an on time program (OTP) manner using a laser fuse or an electric fuse at a test stage prior to product release, or may be performed using mode register set (MRS) according to a user's environment during initialization including power-up or during use.

During use, various schemes may be applied such that calibration may be performed during wake-up after power down or deep power down or may be periodically performed using a counter, or an offset may be detected frequently and calibrated.

The offset calibration process shown in FIG. 15 is applicable to any calibration process during a test prior to product release or during the user's initialization, as will be described in detail below.

Although the following description will be made using an example where in a semiconductor memory device, which is three-dimensionally stacked with a TSV, data of a memory core stacked as an upper layer is transmitted to a chip stacked as a lower layer according to a read command, offset calibration is not limited to this example.

Referring to FIG. 15, upon generation of a data read command from a memory controller in operation S150, data of a memory cell positioned at an address is output from the memory core, for example, through addressing processes.

Cell data passing through a bit line, a bit line sense amplifier, a local input/output line, a global input/output line, and so forth is transmitted to an input/output buffer (more specifically, an output buffer) through an input/output sense amplifier. The output buffer includes an offset circuit which has the offset voltage Voffset that is higher than the ground voltage VssQ. The offset circuit is configured using a diode or a resistor and can be controlled by a switch connected in parallel thereto.

Since each output buffer has an initially set offset voltage, the offset voltage is detected from each input/output buffer in operation S151. Upon generation of an initial data read command, addressing is performed such that an offset voltage can be read sequentially from a plurality of output buffers disposed to correspond to memory cores. For example, the offset voltages of the plurality of output buffers may be sequentially read by the read command. Also, the offset voltages may be read according to a command for sequentially outputting data from output buffers of all memory cores like as a self-refresh process in which addressing is sequentially performed on all cells.

Until offset detection for calibration is performed on all target output buffers, this process is repeated in operation S152. In operation S153, it is determined whether an offset voltage is within a normal range in each output buffer. If so, calibration is finished. Otherwise, if the offset voltage is not within the normal range, the offset voltage is calibrated using a switching operation in operation S154 and then the foregoing process is repeated.

Figure 16:
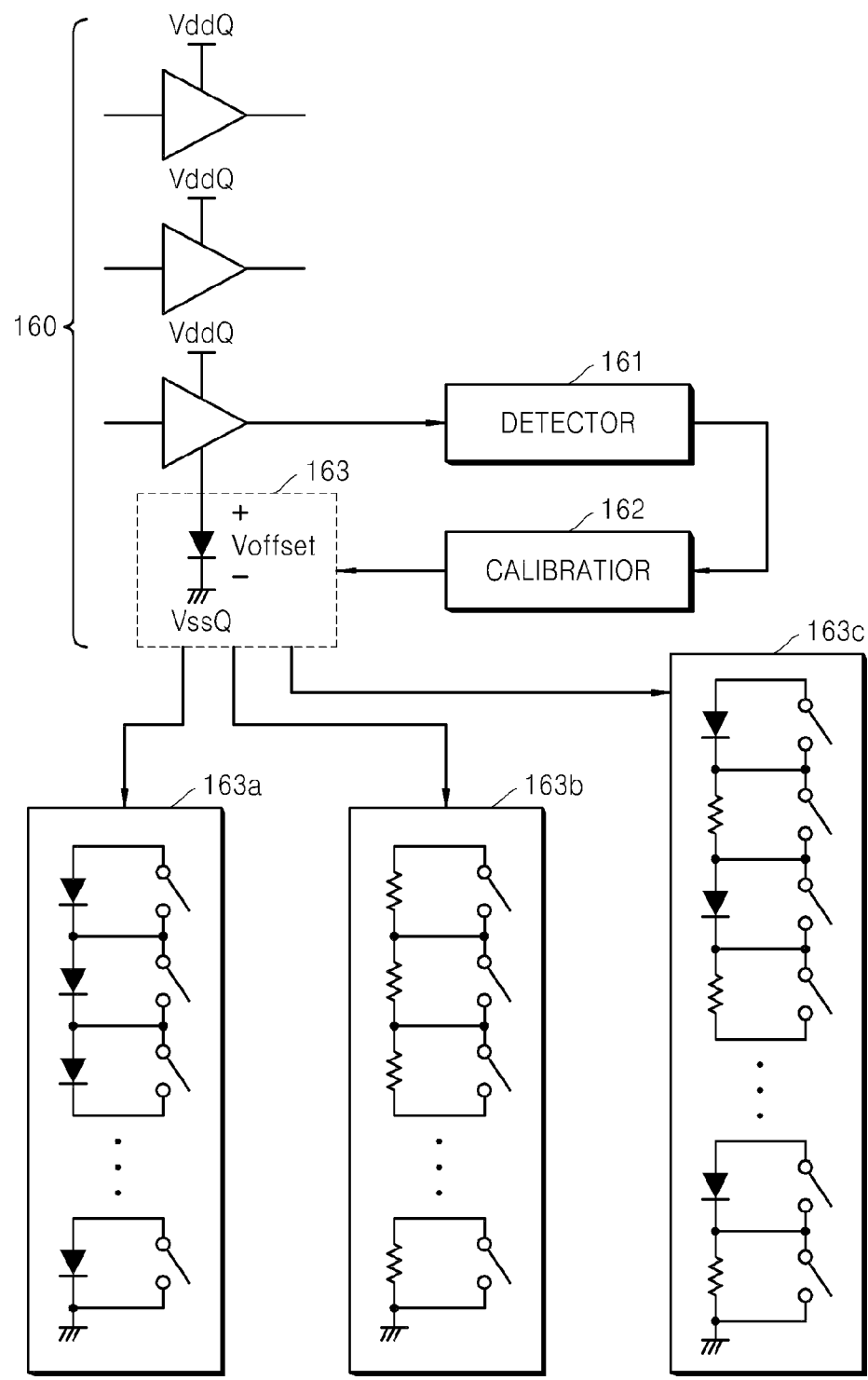
FIG. 16 is a diagram schematically illustrating an example of a semiconductor device for the offset calibration process illustrated in FIG. 15.

FIG. 16 is a diagram schematically illustrating an example of a semiconductor device for the offset calibration process illustrated in FIG. 15.

Referring to FIG. 16, the semiconductor device includes a plurality of input/output buffers 160, each having an offset circuit 163, a detector 161 for detecting an offset voltage of each input/output buffer 160, and a calibrator 162 for calibrating an offset voltage according to the detection result. In FIG. 16, for convenience' sake, the offset circuit 163 is included in a single input/output buffer 160 and the detector 161 and the calibrator 162 correspond to the offset circuit 163.

The detector 161 and the calibrator 162 may be provided for each input/output buffer 160, or they may be shared among the plurality of input/output buffers 160.

The detector 161 and the calibrator 162 may be disposed in each layer including memory cores, or all detectors 161 and calibrators 162 may be disposed in a single chip such as an interface chip.

As shown in FIG. 16, the offset circuit 163 may include a combination 163*a* of diodes and switches, a combination 163*b* of resistors and switches, or a combination 163*c* of diodes, switches, and resistors. By controlling on/off of switches according to an output of the calibrator 162, the offset voltage can be controlled.

Figure 17A:
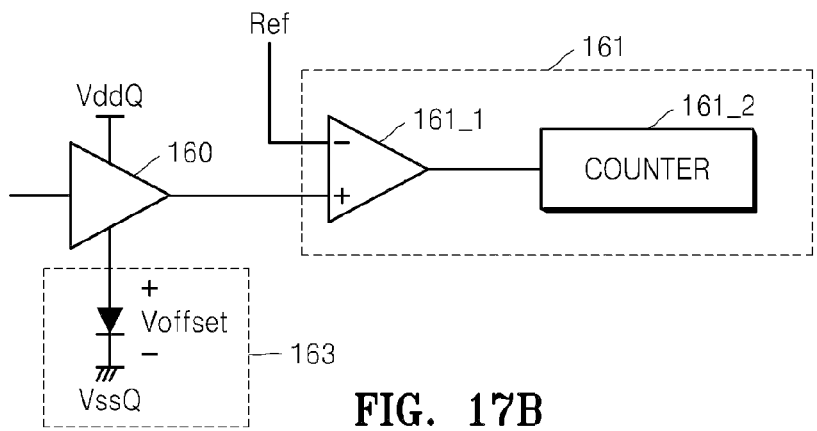
FIG. 17 is a diagram illustrating an example of a detector illustrated in FIG. 16.
Figure 17B:
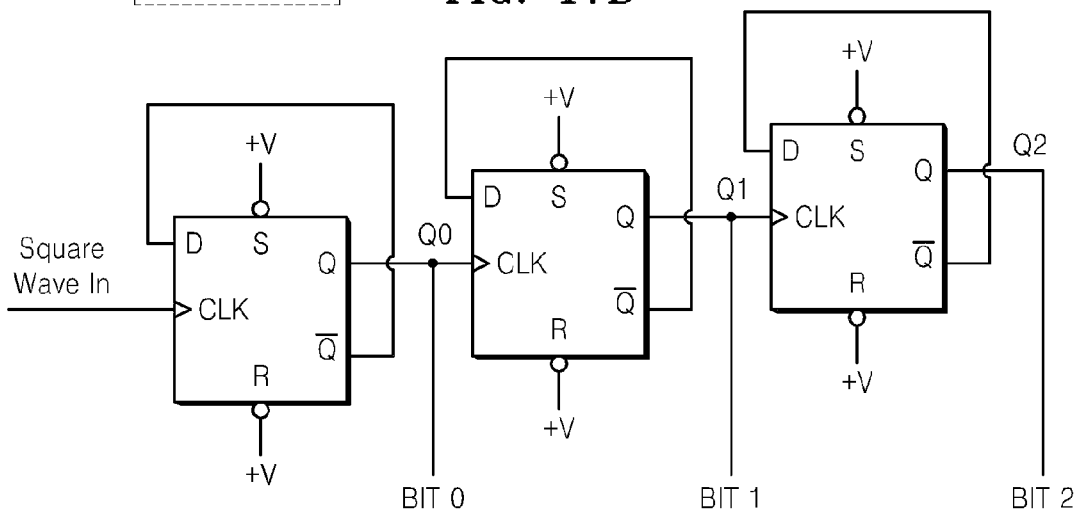
Figure 17C:
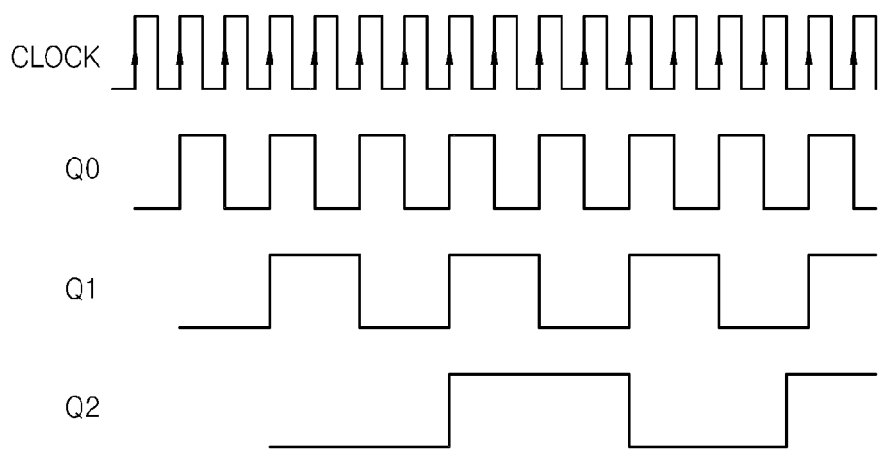

FIG. 17 is a diagram showing an example of the detector 161 shown in FIG. 16.

Referring to 17A, the detector 161 includes a comparator 161_1 and a counter 161_2. The comparator 161_1 compares an offset voltage of the offset circuit 163 included in the input/output buffer 160 with a reference voltage Ref. The counter 161_2 counts and outputs a comparison result of the comparator 161_1. The counter 161_2 may have various structures. Referring to 17B shows a representative example of the counter 161_2, a ripple counter, and Referring to 17C shows an operating waveform thereof.

An asynchronous ripple counter has a d-flipflop structure which uses its inverted output /Q as a data input D, and by connecting asynchronous ripple counters in three stages, as shown in FIG. 17B, three-bit data can be stored. The detailed operation of the ripple counter will not be described.

The counter 161_2 may also be implemented in other forms, such as a ring counter, a Johnson counter, a decade counter, an up-down counter, etc., as well as a ripple counter.

As mentioned previously, in the inventive concept, offset signaling is applied to optimize signal transmission through a TSV by minimizing an influence of a MOS capacitance due to the TSV.

Since the MOS capacitance may have a large influence upon high-speed signaling, offset signaling is applied to a TSV transmission line for high-speed signaling and signaling for full-swing from a ground voltage to a power voltage may be applied to low-speed signaling.

For high-speed transmission, a TSV to which offset signaling is applied may be used; however, for low-speed transmission, wire bonding may be used.

FIG. 18 shows cross-sectional views of examples of semiconductor devices to which a high-speed TSV and a low-speed TSV are applied.

Figure 18A:
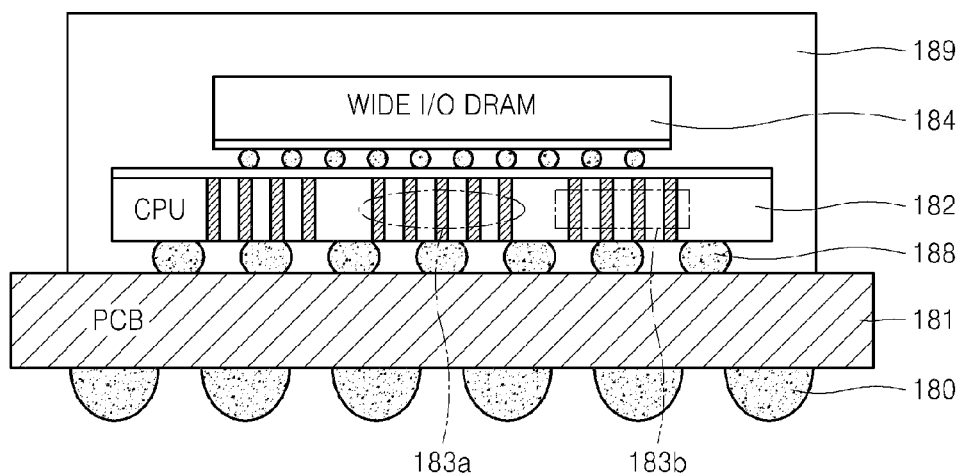
FIG. 18 show cross-sectional views illustrating examples of semiconductor devices to which high-speed and low-speed TSVs are applied.

FIG. 18A shows an example where a central processing unit (CPU) 182 and a multi-channel DRAM 184 are stacked, and FIG. 18A shows an example where the CPU 182, the multi-channel DRAM 184, and a plurality of storage memories 185 are stacked. Since FIG. 18A includes components shown in FIG. 18A, a description of components shown in FIG. 18A may apply to a description of the components shown in FIG. 18A.

Figure 18B:
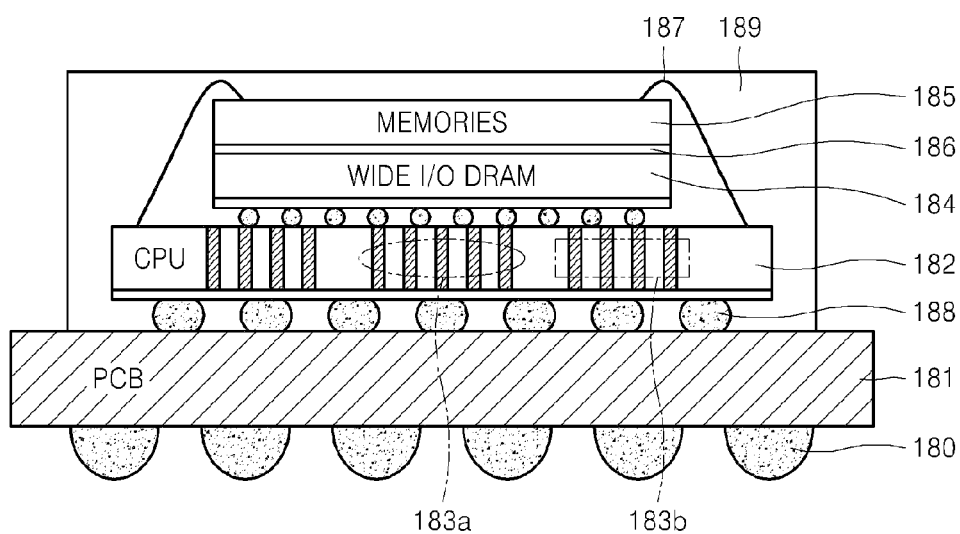

Referring to FIG. 18B, external connection terminals 180 for electric connection to an external device are disposed under a substrate 181, and the CPU 182 is disposed on the substrate 181. Upper and lower portions of the CPU 182 are connected through TSVs 183*a* and 183*b* under which connection terminals 188 are disposed. The multi-channel DRAM 184 is disposed on the CPU 182, and the plurality of storage memories 185 are stacked on the multi-channel DRAM 184 with an insulator 186 between the plurality of storage memories 185 and the multi-channel DRAM 184. The plurality of storage memories 185 are electrically connected with the CPU 182 through wire bonding 187. An entire surface including the plurality of storage memories 185 is covered with a molding material 189.

The CPU 182 may provide various signals such as a voltage signal, a control signal, and data to the multi-channel DRAM 184 and the plurality of memories 185 or provide the signals to an external device through the substrate 181. Such various signals include a signal transmitted in the form of a high frequency (high-speed signal) and a signal transmitted in the form of a low frequency (low-speed signal). As previously illustrated, data may be transmitted as a high-speed signal and a signal such as a command or address or a voltage signal may be transmitted as a low-speed signal. The TSVs 183*a* and 183*b* included in the CPU 182 include the TSV 183*a* for high-speed transmission and the TSV 183*b* for low-speed transmission. The high-speed transmission TSV 183*a* transmits a signal to which foregoing offset signaling is applied, and the low-speed transmission TSV 183*b* transmits a signal to which offset signaling is not applied (for example, a signal having full swing between a ground voltage and a power voltage). While the memories 185 are illustrated to transmit a signal to and receive a signal from the CPU 182 through the wire bonding 187 in FIG. 18B, some signal may be transmitted and received through a TSV (183*a*, 183*b*) included in the CPU 182 and a TSV (not shown) disposed in the multi-channel DRAM 184. In this case, a high-speed signal transmitted to the plurality of memories 185 may be transmitted through the wire bonding 187, and a high-speed signal may be transmitted to the plurality of memories 185 through TSVs disposed in the CPU 182 and the multi-channel DRAM 184. In addition, when the low-speed transmission TSV 183*b* and the high-speed transmission TSV 183*a* are used in common by the multi-channel DRAM 184 and the plurality of memories 185, the high-speed transmission TSV 183*a* may transmit a signal to the plurality of memories 185 by using offset signaling and the low-speed transmission TSV 183*b* may transmit a signal to the plurality of memories 185 without using offset signaling. To transmit a signal to the plurality of memories 185, another additional TSV may be provided in the CPU 182 and a high-speed signal may be transmitted to the plurality of memories 185 through the additional TSV.

Although it is shown in FIG. 18B that the plurality of memories 185 are connected to the CPU 182 through the wire bonding 187, the embodiment of the inventive concept is not limited thereto. For example, the plurality of memories 185 may be directly connected to the substrate 181 through the wire bonding 187. In this case, access to the plurality of memories 185 may be directly controlled from outside. Alternatively, the plurality of memories 185 may be connected to both the CPU 182 and the substrate 181 through the wire bonding 187.

Figure 19:
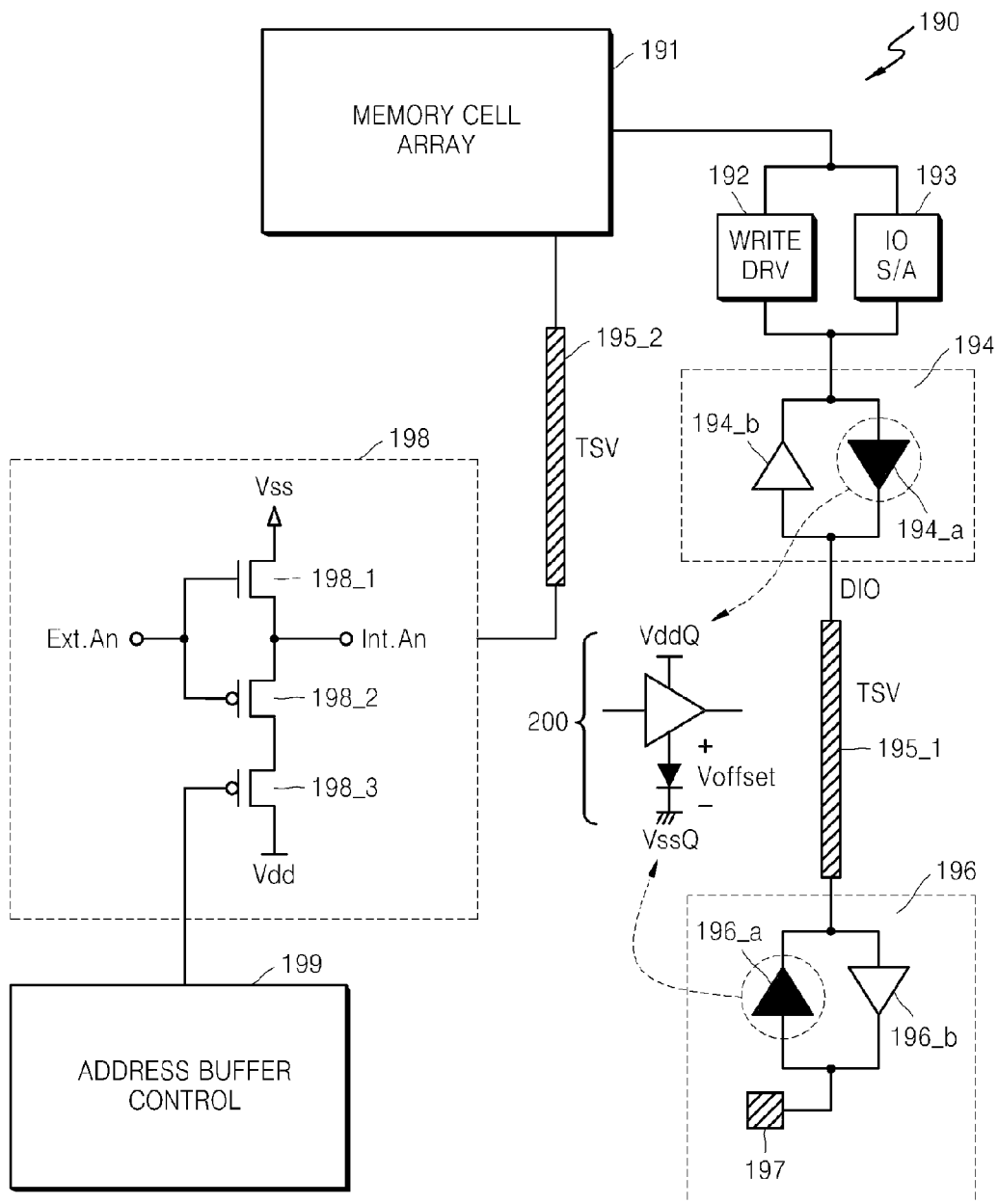
FIG. 19 is a diagram illustrating an example of a semiconductor memory device illustrated in FIG. 18.

FIG. 19 is a diagram illustrating an example of a 3D semiconductor memory device 190 to which a high-speed TSV and a low-speed TSV are applied.

In FIG. 19, the 3D semiconductor memory device 190 uses a TSV structure illustrated in FIGS. 3, 6, and 7.

Referring to FIG. 19, the 3D semiconductor device 190 having a TSV structure includes a DRAM chip (not shown) and an interface chip (not shown) which are stacked at upper and lower portions and are interconnected through TSVs 195_1 and 195_2. The TSV 195_1 for data transmission transmits data between upper and lower chips, and the TSV 195_2 for address transmission transmits an address signal between the upper and lower chips. In the example shown in FIG. 19, a signal transmitted through the data transmission TSV 195_1 is an offset signaling-applied signal and a signal transmitted through the address transmission TSV 195_2 is a signal to which offset signaling is not applied.

Although the DRAM chip and the interface chip are not illustrated in detail in FIG. 19, an address buffer 198, an address buffer controller 199, and a input/output buffer 196 are provided in the interface chip and a memory cell array 191 and a input/output buffer 194 are provided in the DRAM chip.

The interface chip may include an address buffer for inputting and buffering an address from an external device, a command buffer for receiving and buffering a command from the external device and decoding the command, a input/output buffer for inputting or outputting data, a voltage generator for generating a necessary power voltage, and a peripheral circuit including logic for controlling overall operation of the interface chip.

More specifically, the upper DRAM chip includes a memory cell array including a plurality of memory blocks each including a plurality of memory cells having various structures of a single capacitor and a single transistor or a single transistor and disposed in various ways with word lines, bit lines, and sense amplifiers; a column decoder which inputs and decodes an address and outputs a column address for selecting a column line of a respective memory block; a row decoder which inputs and decodes an address and outputs a row address for selecting a row line of a respective memory block; a write driver 192; an input/output sense amplifier 193; and an input/output buffer 194.

The input/output buffer 194 includes an input buffer 194_*b* and an output buffer 194_*a*. Since the output buffer 194_*a* has to transmit a high-speed data signal through a TSV 195_1, the output buffer 194_*a* includes an offset circuit 200 for offset signaling such that the signal transmitted through the TSV 195_1 can fully swing from "Voffset" that is higher than "0V" to the CMOS level of the power voltage VddQ.

The input/output buffer 196 included in the interface chip includes an output buffer 196_*a* and an input buffer 196_*b*. Since the output buffer 196_*a* has to transmit a high-speed data signal to the upper DRAM chip through the TSV 195_1, the output buffer 196 includes the offset circuit 200 for offset signaling such that the signal transmitted through the TSV 195_1 can fully swing from "Voffset" that is higher than "0V" to the CMOS level of the power voltage VddQ.

The 3D semiconductor device 190 includes the address buffer 198 which receives and buffers the external address signal Ext.An to output the internal address signal Int.An. The 3D semiconductor device 190 also includes the address buffer controller (written as CONTROL) 199 for controlling transmission of an address signal through the address buffer 198.

The address buffer 198 includes a CMOS inverter including an NMOS transistor 198_1 and a PMOS transistor 198_2, and a PMOS transistor 198_3 which is connected between the CMOS inverter and the power voltage Vdd and has a gate controlled by an output of the address buffer controller 199.

The detailed operations of the address buffer controller 199 and the address buffer 198 have already been described with reference to FIGS. 3 through 7 and thus will not be described in detail at this point.

As illustrated in FIG. 19, in the case of a semiconductor memory device, data requires a relatively high-speed operation, and thus for data transmission through a TSV, the data is transmitted through the high-speed transmission TSV 195_1 by applying offset signaling; whereas an address or a command requires a relatively low-speed operation, and thus for transmission of an address or a command through a TSV, the address or command to which offset signaling is not applied (e.g., a signal which fully swings from the ground voltage to the power voltage) is transmitted through the low-speed transmission TSV 195_2.

Figure 20:
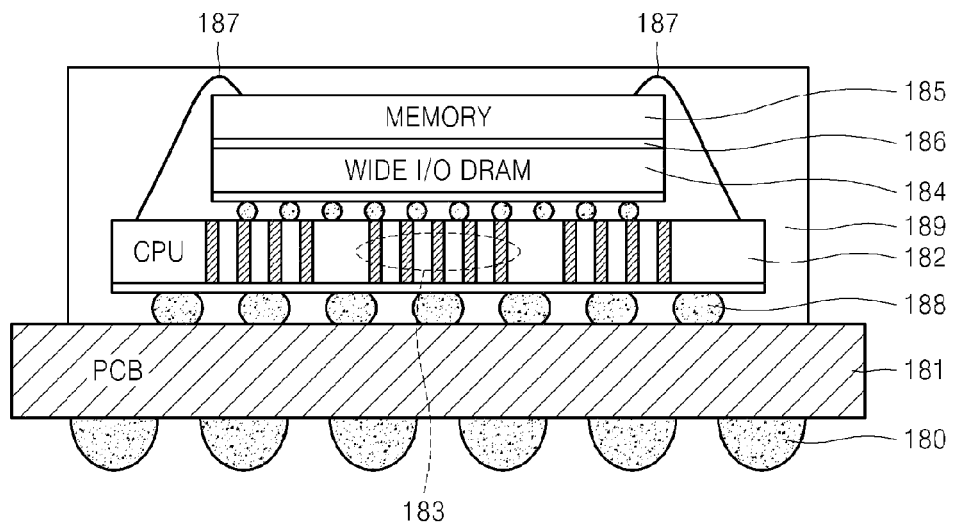
FIGS. 20 and 21 are cross-sectional views illustrating modifications of the example of the semiconductor device illustrated in FIG. 18.
Figure 21:
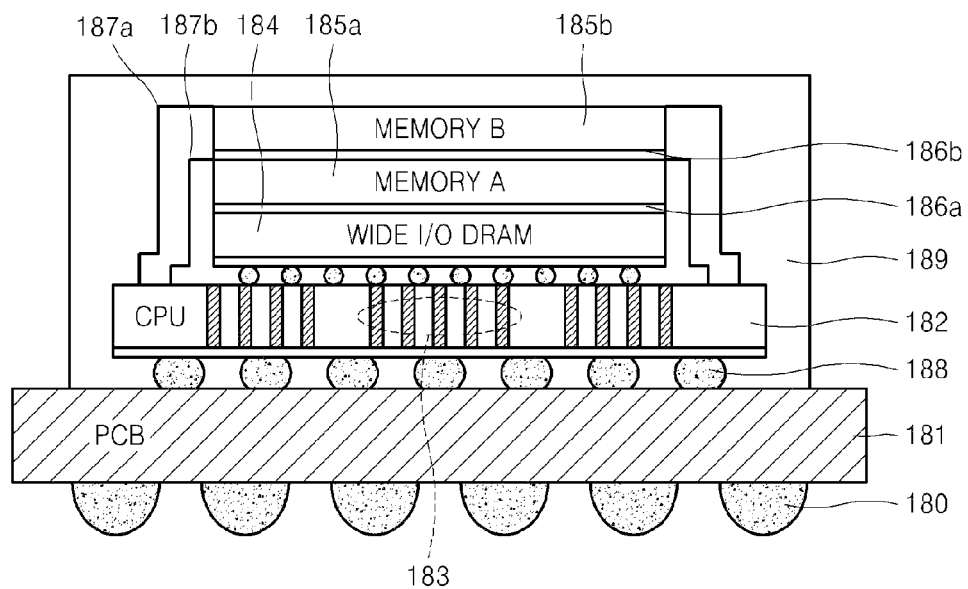

FIGS. 20 and 21 show modifications of the example of the semiconductor device 190 illustrated in FIG. 18. In the semiconductor device illustrated in FIG. 20, the same components as those illustrated in FIG. 18B will be indicated by the same reference numerals as used in FIG. 18B and a detailed description thereof will not be provided.

In FIG. 18B, the TSV 183 includes the high-speed transmission TSV 183*a* and the low-speed transmission TSV 183*b* such that offset signaling is applied only to the high-speed transmission TSV 183*a*. However, in FIG. 20, offset signaling is applied to any TSV 183 for the same high-speed operation, but typical CMOS full-swing signaling through the wire bonding 187 is applied to low-speed signaling between the storage memory 185 and the CPU 182.

In FIG. 21, storage memories 185*a* and 186*b* are stacked as a storage memory 185 shown in FIG. 20, and insulators 186*a* and 186*b* are respectively disposed between the multi-channel DRAM 184 and the storage memory 185_*a* and between the storage memory 185*a* and the storage memory 185*b*. The stacked memories 185*a* and 185*b* are connected with the CPU 182 through wire bonding 187*a* and wire bonding 187*b*, respectively.

For the same high-speed operation for any TSV 183, offset signaling is applied. For low-speed signaling between the storage memories 185*a* and 185*b* and the CPU 182, typical CMOS full-swing signaling through the wire bonding 187*a* and 187*b* is applied.

As described in FIG. 18B, the memory 185 may be directly connected to the substrate 181 through the wire boding 187 or the memory 185 may also be connected to both the CPU 182 and the substrate 181 through the wire bonding 187.

Figure 22A:
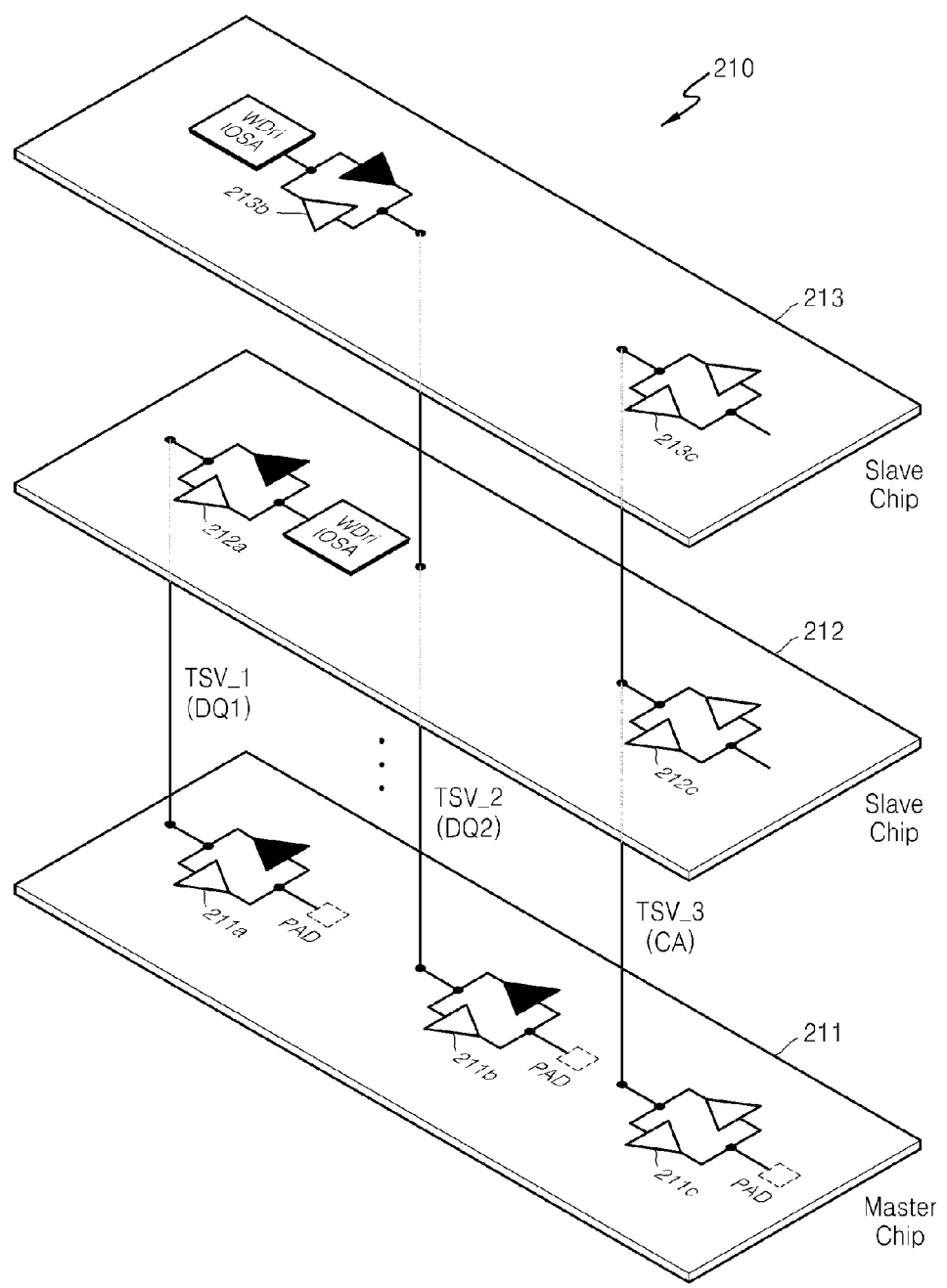
FIGS. 22A and 22B are schematic diagrams illustrating modifications of a semiconductor device to which TSVs for transmitting data bi-directionally and unidirectionally are applied.

FIG. 22A is a circuit diagram showing an example where offset signaling having different characteristics is applied to different chips in a semiconductor device 210 including a plurality of chips 211, 212, and 213. As illustrated in FIG. 22A, the semiconductor device 210 includes a master chip 211 which controls driving of a memory and includes a logic circuit for interfacing with an external device and one or more slave chips 212 and 213, each of which includes a plurality of memory blocks. To describe an input/output buffer for signal transmission through a TSV and offset signaling, only related components are shown in FIG. 22A. In FIG. 22A, the semiconductor device 210 includes a plurality of chips to describe offset signaling through a TSV. However, a single semiconductor chip may include a plurality of layers which include a master region and slave regions, and a related illustration will not be provided.

The semiconductor device 210 in which a plurality of chips are stacked may include a memory including a plurality of banks or a plurality of ranks. Each memory bank or rank may be controlled in association with a write/read operation with respect to the memory, and a TSV for data transmission may be separately disposed for each chip to prevent data collision between different slave chips during data transmission. For example, a first slave chip 212 may bi-directionally exchange data DQ1 with the master chip 211 through a first TSV TSV_1, and a second slave chip 213 may bi-directionally exchange data DQ2 with the master chip 211 through a second TSV TSV_2. A command or an address may be transmitted from the master chip 211 to the first and second slave chips 212 and 213 through the same TSV (for example, a third TSV TSV_3).

For data transmission, offset signaling is applied to input/output buffers 211*a* and 211*b* included in the master chip 211. Thus, the input/output buffers 211*a* and 211*b* transmit offset signaling-applied data to the first slave chip 212 and the second slave chip 213 through the first TSV TSV_1 and the second TSV TSV_2, respectively. Likewise, an input/output buffer 212_*a* provided in the first slave chip 212 transmits offset signaling-applied read data to the master chip 211 through the first TSV TSV_1, and an input/output buffer 213_*b* provided in the second slave chip 213 transmits offset signaling-applied read data to the master chip 211 through the second TSV TSV_2. A command/address may be transmitted to the first slave chip 212 and the second slave chip 213 through the third TSV TSV_3 connected in common, and on the assumption that the command/address requires low-speed transmission, offset signaling is not applied to input/output buffers 211*c*, 212*c*, and 213*c* for transmitting the command/address.

As such, when separate TSVs are provided for different chips, the first TSV TSV_1 for transmitting data to the first slave chip 212 and the second TSV TSV_2 for transmitting data to the second slave chip 213 may have different physical length (or distance). According to the physical length, a capacitance generated by nature of a TSV may change. In this case, to reduce a variation in signal characteristics between TSVs, different levels of an offset voltage corresponding to offset signaling may be applied to different chips. For example, offset voltages may be set to be different for the input/output buffers 211*a* and 212*a* for transmitting a signal through the first TSV TSV_1 and the input/output buffers 211*b* and 213*b* for transmitting a signal through the second TSV TSV_2. Adjustment of a level of an offset voltage for each input/output buffer can be easily achieved by referring to the embodiment shown in FIGS. 16 and 17.

Figure 22B:
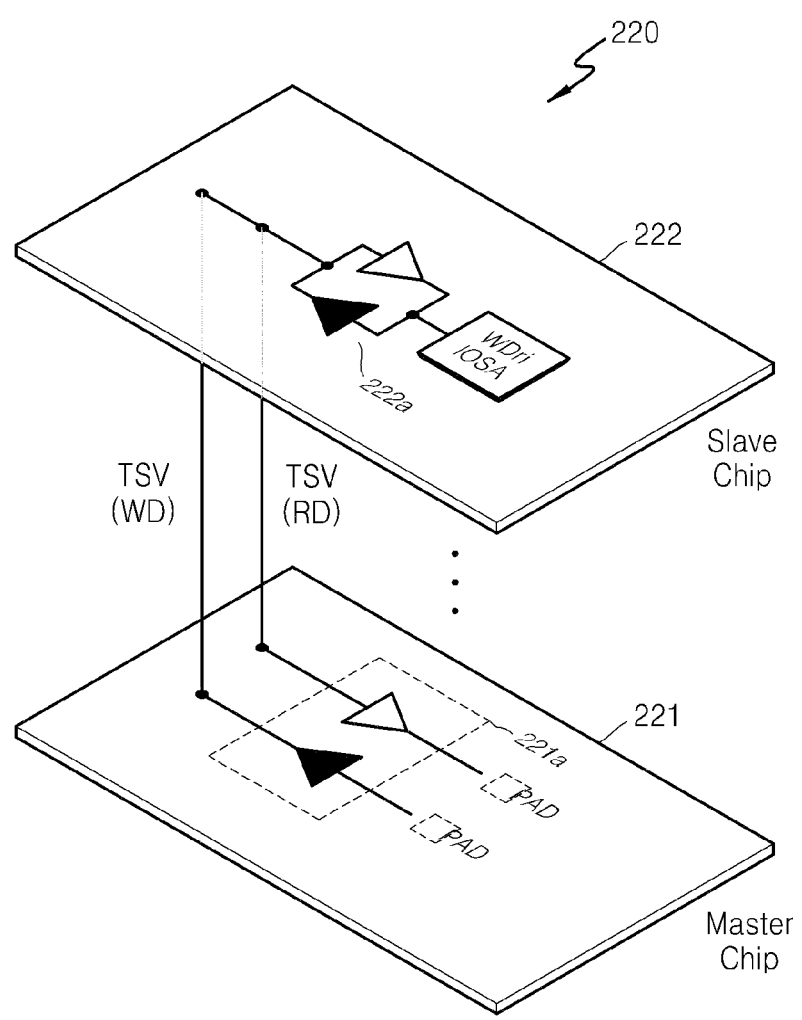

FIG. 22B shows an example where during data transmission for a plurality of chips, a transmission path for write data WD and a transmission path for read data RD are separated for control in units of a memory bank or rank. Thus, a TSV for transmitting the write data WD and a TSV for transmitting the read data RD are formed to be separated from each other.

The master chip 221 receives the write data WD from an external device or provides the read data RD to the external device through different pads. The input/output buffer 221_*a* of the master chip 221 transmits the write data WD to the slave chip 222 through a TSV by applying offset signaling. The input/output buffer 222_*a* included in the slave chip 222 transmits the read data RD to the master chip 221 through a TSV by applying offset signaling.

When a memory device 220 is implemented as shown in FIG. 22B, a chip (for example, the master chip 221) includes a plurality of buffers, some of which are connected to a write data TSV and the others of which are connected to a read data TSV. The plurality of buffers may also be divided into buffers to which offset signaling is applied and buffers to which offset signaling is not applied, according to their connected TSVs. For example, the master chip 221 includes buffers which transmit a signal through the write data TSV and to which offset signaling is applied and buffers which transmit a signal through the read data TSV and to which offset signaling is not applied.

FIG. 23 is a block diagram of an application example according to the inventive concept, which is connected to a memory controller. In FIG. 23, various forms of memory bus protocols are shown.

Figure 23A:
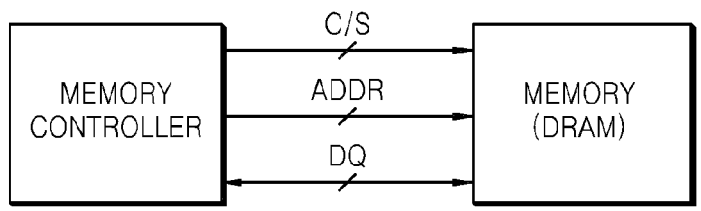
FIG. 23 is a block diagram illustrating an application example of the inventive concept connected with a memory controller.

Referring to FIG. 23A, a bus protocol between a memory controller and a memory, e.g., DRAMs is disclosed and a control signal C/S such as /CS, CKE, /RAS, /CAS, or /WE and an address signal ADDR are provided from the memory controller to the memory. Data DQ is transmitted bi-directionally.

Herein, offset signaling through a TSV may be applied only to the data DQ or signaling through a TSV may be applied to any signal.

Figure 23B:
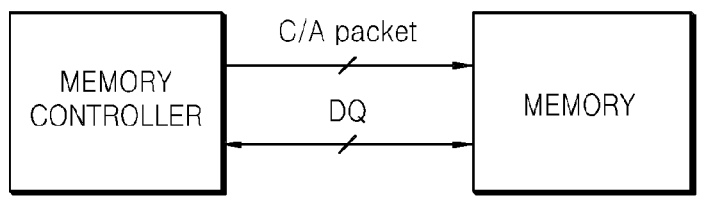

Referring to FIG. 23B, packetized control signals and address signals (C/A packet) are provided from the memory controller to the memory and the data DQ is transmitted bi-directionally.

Figure 23C:
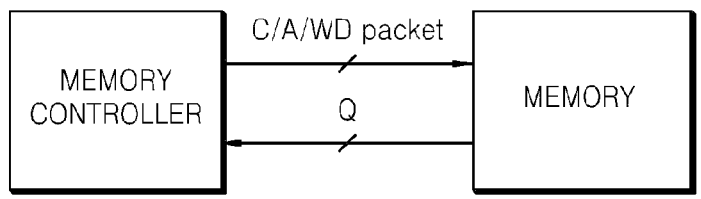

Referring FIG. 23C, packetized control signals, address signals, and write signals (C/A/WD packet) are provided from the memory controller to the memory and a data output Q is transmitted unidirectionally from the memory to the memory controller.

Figure 23D:
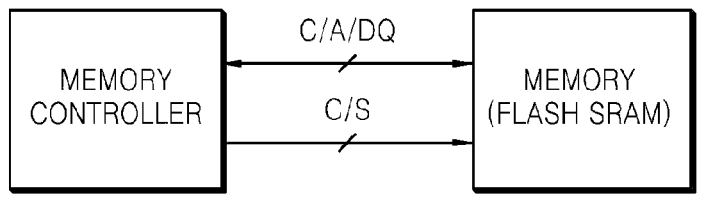

Referring to FIG. 23D, control signals (C/S) are provided from the memory controller to the memory, e.g., a flash SRAM and commands, addresses, and data (C/A/DQ) are transmitted bi-directionally.

Figure 24:
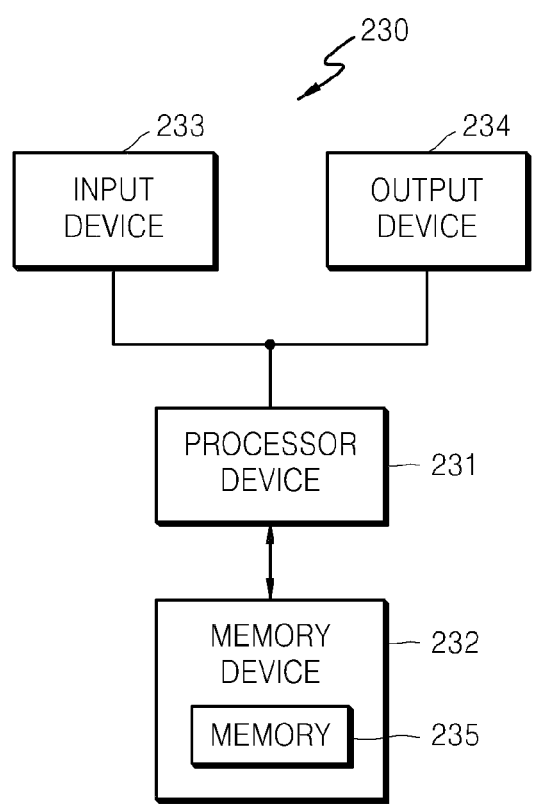
FIG. 24 is a block diagram illustrating an application example of an electronic system including a 3D stacked structure semiconductor memory device according to an exemplary embodiment of the inventive concept.

FIG. 24 is a block diagram showing an application example of an electronic system 230 including a 3D stacked structure semiconductor memory device having a TSV.

Referring to FIG. 24, the electronic system 230 includes an input device 233, an output device 234, a memory device 232, and a processor device 231.

The memory device 232 includes an interface chip and/or a memory controller, and a 3D stacked structure memory 235 having a TSV. The interface and/or memory controller may form a 3D stacked structure with the memory 235.

The processor device 231 is connected to the input device 233, the output device 234, and the memory device 232 through corresponding interfaces to control overall operation of the electronic system 230.

Figure 25:
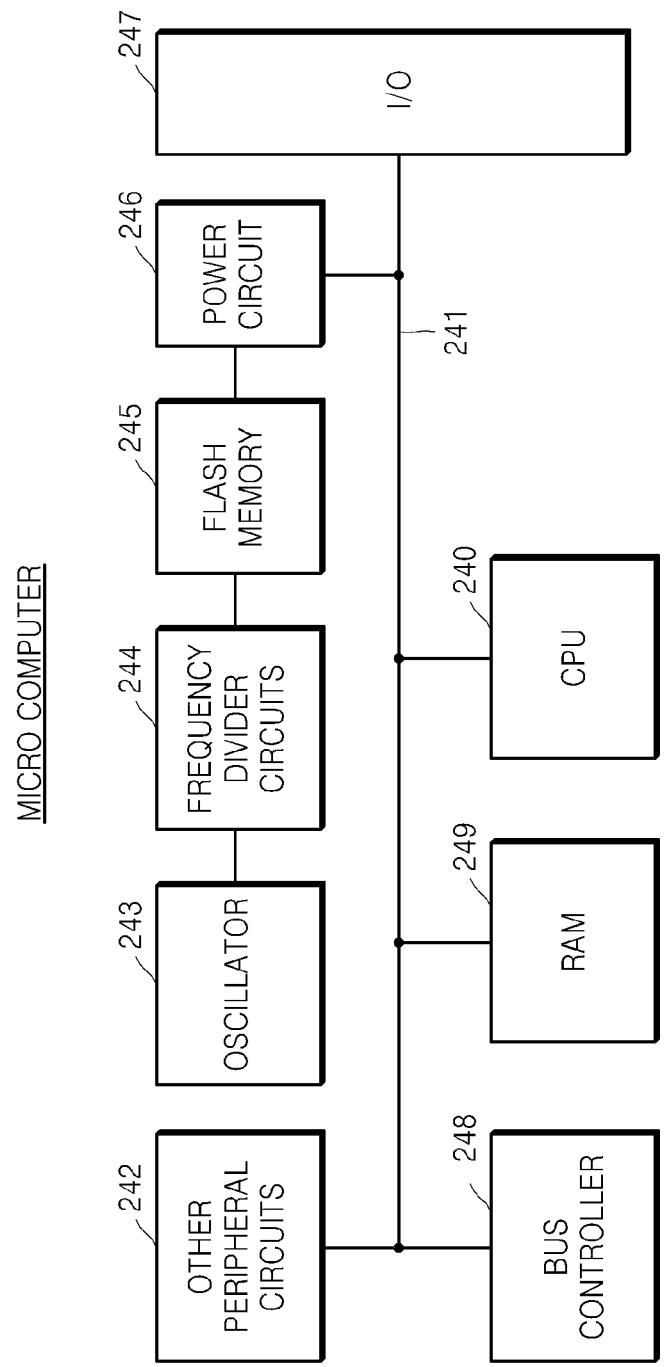
FIG. 25 is a block diagram illustrating an application example of a single-chip micro computer including a 3D stacked structure semiconductor memory device according to an exemplary embodiment of the inventive concept.

FIG. 25 is a block diagram showing an application example of a single-chip micro computer including a 3D stacked structure semiconductor memory device.

Referring to FIG. 25, the micro computer in the form of a circuit module includes a CPU 240, a 3D stacked memory having a TSV structure, e.g., a RAM 249 used as a work area of the CPU 240, a bus controller 248, an oscillator 243, a frequency divider 244, a flash memory 245, a power circuit 246, an input/output port 247, and other peripheral circuits 242 including a timer counter and so forth. Components included in the micro computer are connected to an internal bus 241.

The CPU 240 includes a command control part (not shown) and an execution part (not shown), and decodes a fetched command through the command control part and performs a processing operation through the execution part according to the decoding result.

The flash memory 245 stores not only an operation program or data of the CPU 240 but also data of various types. The power circuit 246 generates a high voltage required for erase and write operations of the flash memory 245.

The frequency divider 244 divides a source frequency provided from the oscillator 243 into a plurality of frequencies to provide reference clock signals and other internal clock signals.

The internal bus 241 includes an address bus, a data bus, and a control bus.

Herein, the RAM 249 has a TSV structure, such that various signals such as data or an address are transmitted through a TSV and the memory device may be stacked with the memory controller or with other peripheral devices. In this case, for signaling through the TSV, offset signaling may be applied only to high-speed signals such as data or may be applied to any signal line through the TSV.

The bus controller 248 controls bus accesses to a predetermined cycle number in response to an access request from the CPU 240. Herein, the access cycle number is related to a wait state and a width of a bus corresponding to an accessed address.

When the micro computer is mounted on the system, the CPU 240 controls the erase and write operations with respect to the flash memory 245. In a device test or manufacturing stage, the erase and write operations with respect to the flash memory 245 can be directly controlled by an external recording device through the input/output port 247.

Figure 26A:
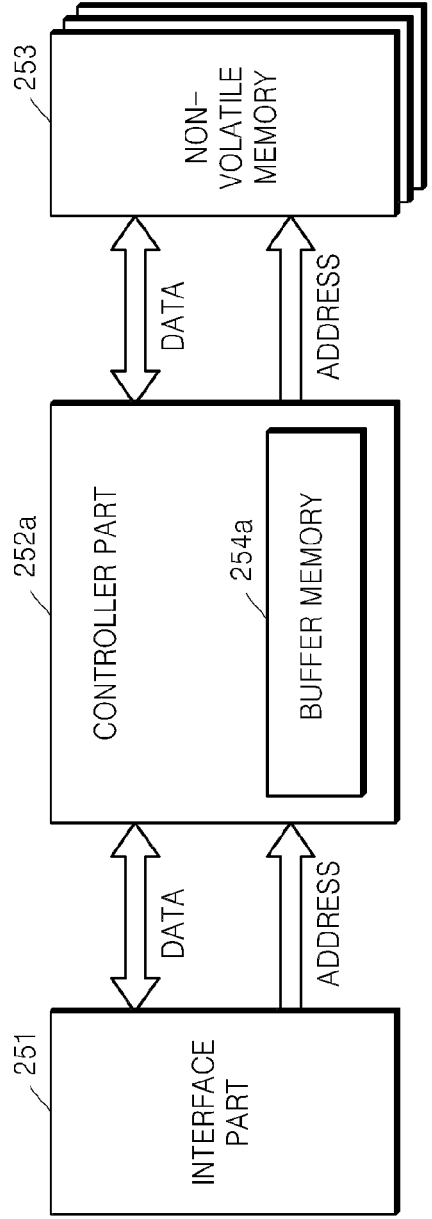
FIG. 26 is a block diagram illustrating an application example of a memory card to which a non-volatile 3D stacked structure semiconductor memory device according to an exemplary embodiment of the inventive concept is applied.
Figure 26B:
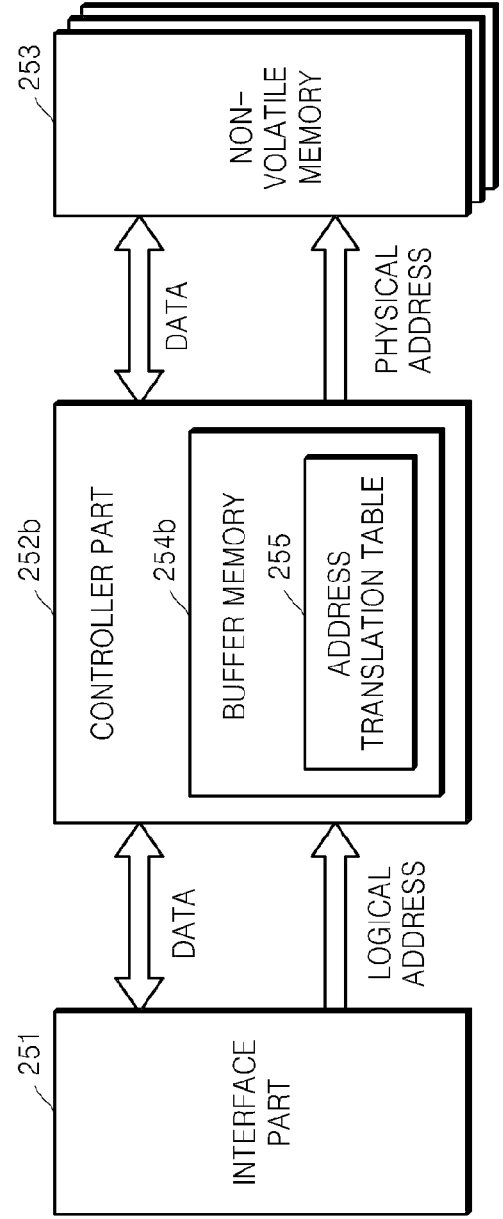

FIGS. 26A and 26B show application examples of a memory card to which a non-volatile 3D stacked semiconductor memory device having a TSV according to the inventive concept is applied.

Referring to FIGS. 26A and 26B, a memory card includes an interface part 251, a controller 252a or 252b which includes a buffer memory 254a or 254b and controls an operation of the memory card, and at least one non-volatile memory 253 having a 3D stacked structure with a TSV.

As discussed above, offset signaling is applied to the non-volatile memory 253 through the TSV. In this case, offset signaling may be applied only for data or may be applied also for an address or a command as well as for data.

The controller 252a or 252b is connected to the interface part 251 through a data bus DATA and an address bus ADDRESS, and is connected with the non-volatile memory 253 through the data bus DATA and the address bus ADDRESS.

In FIG. 26B, the memory card includes an address translation table 255 for translating a logical address input from an external device into a physical address of the non-volatile memory 253, in the controller 252b, more specifically, in the buffer memory 254b of the controller 252b.

For example, in the write operation, new data is written to an arbitrary physical address. The memory card having the address translation table 255 may provide a physical address for selecting a memory array capable of performing the write operation.

As described above, an influence of a MOS capacitance of a TSV in a semiconductor device having a 3D stacked structure with a TSV can be alleviated by offset signaling.

The description of the embodiments of the inventive concept has been provided with reference to the drawings for thorough understanding of the inventive concept, and thus should not be construed to be intended to limit the inventive concept. It is also apparent to those of ordinary skill in the art that various changes and modifications can be made without departing from the basic principle of the inventive concept.

What is claimed is:

1. A three-dimensional (3D) semiconductor device comprising:
   a plurality of stacked layers; and
   a through-silicon via (TSV) electrically connecting the plurality of layers,
   wherein in signal transmission among the plurality of layers, the TSV transmits a signal that swings in a range from an offset voltage that is higher than a ground voltage to a power voltage;
   wherein each of the plurality of layers comprises an input/output buffer connected to the TSV, and the input/output buffer comprises a driver circuit which outputs a signal transmitted through the TSV and an offset circuit which causes an output signal of the driver circuit to have a level of the offset voltage.

2. The 3D semiconductor device of claim 1, wherein the TSV comprises a first conductive material and an insulator is disposed between the first conductive material and a second conductive material of each layer, and
   the first conductive material, the insulator, and the second conductive material form a capacitor.

3. The 3D semiconductor device of claim 2, wherein the capacitor operates in a region where a capacitance of the capacitor decreases as a voltage increases.

4. The 3D semiconductor device of claim 2, wherein the first conductive material comprises metal, the second conductive material comprises semiconductor, and the capacitor is a metal-oxide-semiconductor (MOS) capacitor.

5. The 3D semiconductor device of claim 1, wherein the offset circuit is connected between the ground voltage and the driver circuit and comprises a diode or a resistor.

6. A three-dimensional (3D) semiconductor device comprising:
 a plurality of stacked layers; and
 a through-silicon via (TSV) electrically connecting the plurality of layers,
 wherein the TSV comprises a first conductive material, an insulator is disposed between the first conductive material and a second conductive material of each layer, and the first conductive material, the insulator, and the second conductive material form a capacitor, and
 first and second logics of a signal transmitted through the TSV are higher than a level of the ground voltage;
 wherein each of the plurality of layers comprises an input/output buffer connected to the TSV, and
 the input/output buffer comprises a driver circuit which outputs a signal transmitted through the TSV and an offset circuit which causes an output signal of the driver circuit to have a level of the offset voltage.

7. The 3D semiconductor device of claim 6, wherein in signal transmission among the plurality of layers, the TSV transmits a signal that swings in a range from the offset voltage that is higher than the ground voltage to the ground voltage.

8. The 3D semiconductor device of claim 6, wherein the capacitor operates in a region where a capacitance of the capacitor decreases as a voltage increases.

9. The 3D semiconductor device of claim 6, wherein the offset circuit is connected between the ground voltage and the driver circuit and comprises a diode or a resistor.

10. The 3D semiconductor device of claim 6, wherein the first conductive material comprises metal, the second conductive material comprises semiconductor, and the capacitor is a metal-oxide-semiconductor (MOS) capacitor.

11. A three-dimensional (3D) semiconductor device comprising:
 a first layer comprising at least one memory cell and input/output buffer;
 a second layer comprising an interface circuit for interfacing with the memory cell and an external device and controlling the memory cell, the second layer being stacked with the first layer;
 at least one through-silicon via (TSV) electrically connecting the first layer and the second layer by passing through at least a portion of the first layer,
 wherein in signal transmission between the first layer and the second layer, the TSV transmits a signal that swings in a range from an offset voltage that is higher than a ground voltage to a power voltage;
 wherein each input/output buffer comprises a driver circuit which outputs a signal transmitted through the TSV and an offset circuit which causes an output signal of the driver circuit to have a level of the offset voltage.

12. The 3D semiconductor device of claim 11, wherein the TSV comprises a first conductive material, an insulator is disposed between the first conductive material and a second conductive material of the first layer, and the first conductive material, the insulator, and the second conductive material form a capacitor.

13. The 3D semiconductor device of claim 12, wherein the capacitor operates in a region where a capacitance of the capacitor decreases as a voltage increases.

14. The 3D semiconductor device of claim 11, wherein the offset circuit is connected between the ground voltage and the driver circuit and comprises a diode or a resistor.

15. The 3D semiconductor device of claim 11, wherein a signal transmitted through the TSV comprises at least one selected from a data signal, an address signal, and a command signal.

16. A three-dimensional (3D) semiconductor device comprising:
 a first layer comprising at least one memory cell and input/output buffer;
 a second layer comprising an interface circuit for interfacing with the memory cell and an external device and controlling the memory cell, the second layer being stacked with the first layer;
 first and second through-silicon via (TSV) electrically connecting the first layer and the second layer by passing through at least a portion of the first layer,
 wherein in signal transmission between the first layer and the second layer, the first TSV transmits a signal that swings in a range from an offset voltage that is higher than a ground voltage to a power voltage, and
 in signal transmission between the first layer and the second layer, the second TSV transmits a signal that swings in a range from the ground voltage to the power voltage;
 wherein each input/output buffer comprises a driver circuit which outputs a signal transmitted through the TSV and an offset circuit which causes an output signal of the driver circuit to have a level of the offset voltage.

17. The 3D semiconductor device of claim 16, wherein the signal transmitted through the first TSV is a higher-speed signal than the signal transmitted through the second TSV.

18. The 3D semiconductor device of claim 17, wherein the signal transmitted through the first TSV comprises a data signal, and the signal transmitted through the second TSV comprises an address or command signal.

* * * * *